(12) United States Patent
Wang

(10) Patent No.: US 9,178,109 B2
(45) Date of Patent: Nov. 3, 2015

(54) SEMICONDUCTOR LIGHT-EMITTING DEVICE AND METHOD OF MANUFACTURING THE SAME

(71) Applicant: Tien Yang Wang, Lexington, MA (US)

(72) Inventor: Tien Yang Wang, Lexington, MA (US)

(*) Notice: Subject to any disclaimer, the term of this patent is extended or adjusted under 35 U.S.C. 154(b) by 169 days.

(21) Appl. No.: 13/769,373

(22) Filed: Feb. 17, 2013

(65) Prior Publication Data

US 2014/0231841 A1   Aug. 21, 2014

(51) Int. Cl.
| | | |
|---|---|---|
| H01L 33/12 | (2010.01) | |
| H01L 27/15 | (2006.01) | |
| H01L 33/20 | (2010.01) | |
| H01L 33/60 | (2010.01) | |

(52) U.S. Cl.
CPC .............. *H01L 33/12* (2013.01); *H01L 27/156* (2013.01); *H01L 33/20* (2013.01); *H01L 33/60* (2013.01); *H01L 2924/0002* (2013.01)

(58) Field of Classification Search
CPC ....... H01L 33/12; H01L 27/156; H01L 33/20; H01L 33/60; H01L 2924/0002
USPC ......... 257/13, 15, E21.09, E33.027, E33.025, 257/E29.024, 103; 438/47, 481
See application file for complete search history.

(56) References Cited

U.S. PATENT DOCUMENTS

| | | | |
|---|---|---|---|
| 4,948,456 A | 8/1990 | Schubert | |
| 6,111,277 A | 8/2000 | Ikeda | |
| 6,410,940 B1 | 6/2002 | Jiang | |
| 6,870,191 B2 | 3/2005 | Niki | |
| 6,995,030 B2 | 2/2006 | Illek | |
| 7,256,483 B2 | 8/2007 | Epler | |
| 7,598,149 B2 | 10/2009 | Dawson | |
| 8,044,412 B2 | 10/2011 | Murphy | |
| 2011/0084307 A1* | 4/2011 | Miki | ..................... C30B 25/183 257/103 |
| 2012/0298952 A1* | 11/2012 | Hikosaka | ................ H01L 33/20 257/13 |

OTHER PUBLICATIONS

Hwan H. Jeong et el., "Improvement of the light output power of GaN based vertical light emitting diodes by a current blocking layer," Electrochemical and solid State Letters, V.13, No. 7, 2010, H237-H239.
H. Y. Kim et al., "Growth of periodic micropits InGaN based LED structure on wet etch patterned sapphire substrate," Phys. Stat. Sol. (c) V.5, No. 6, 2008, pp. 2001-2003.
Dawei Ren et al., "Anisotropic Mg incorporation in GaN growth on nonplanar templates," Appl. Phys. Lett. V.86, 2005, 121901.

* cited by examiner

*Primary Examiner* — Kyoung Lee
*Assistant Examiner* — Ratisha Mehta

(57) ABSTRACT

A light-emitting device is disclosed including a light emitting structure comprising a lower layer of the first conductivity type, an active layer, an upper layer of the second conductivity type; a first electrode connected to the lower layer of the first conductivity type; a second electrode connected to the upper layer of the second conductivity type. The light emitting structure is formed using a shell member, which comprises a planar portion and a shell portion. The extent of growth defects such as misfit dislocations is reduced and the extraction of light and heat is improved in the present device. The beam profile of the device may be altered by patterning the light emitting structure instead of shaping the entire chip. The device may be manufactured in a way more compatible with the established, cost-effective processing and packaging methods for large size wafers from the IC industry.

30 Claims, 16 Drawing Sheets

SEMICONDUCTOR LIGHT-EMITTING DEVICE AND METHOD OF MANUFACTURING THE SAME

BACKGROUND OF THE INVENTION

The present invention relates in general to the fabrication of semiconductor light emitting devices (LED), and in particular, to an LED with improved luminance efficiency.

In a conventional LED, the light emitting structures is disposed on the surface of a substrate wafer comprising an active region sandwiched between upper and lower layer of opposite conductivity. The active region may contain multiple quantum wells (MQW) comprising alternating barrier layer and well layer to improve light generation efficiency. A blocking layer is also preferably included adjacent to the MQW to reduce the carrier leakage. In a GaN LED for example, the MQW contains GaN barrier layers and InGaN well layers in a blue LED. Typical substrates in the production of GaN LED are sapphire, SiC and Si. There are several issues in the conventional device. For example, there is a significant lattice mismatch of 13% and a thermal mismatch of −34% between GaN layer and sapphire. As a result, a stress is imposed in the thin GaN layer when registered on a thick sapphire substrate wafer. The strain energy continues to build up as the layer grows thicker. Beyond a critical thickness, the excess energy is relaxed and the lattice coherence between the layer and the substrate breaks down. This is accompanied by the formation of misfit dislocation defects in the vicinity of the substrate interface. The dislocation defect may find its way to thread into the active region during the high-temperature deposition of the upper layers. This would impair the light generation efficiency of the LED and adversely affect the performance of the device. The situation becomes worse in the GaN/Si materials system, which exhibits a lattice mismatch of 17% and a thermal mismatch of +100% between the GaN layer and the Si substrate wafer. In this case, the relaxation of the excessive strain energy often leads to the formation of micro cracks making the device inoperative. For reliable operation of the GaN LED especially when used in lighting applications, it is essential to achieve a high internal efficiency by keeping the defect level low in the device.

Special techniques using a strained layer superlattice has been attempted to amend the situation. For instance, the misfit dislocation defects may bend over at the interface and are refrained from propagating into the active region. Other methods such as selected area growth (SEG), epitaxial lateral overgrowth (ELO), pendeo-epitaxy and patterned sapphire substrate (PSS) have been demonstrated effective in the reduction of the misfit defects. Devices using the ELO and the PSS methods have been described for example, in U.S. Pat. No. 6,111,277 to Ikeda et al., and in U.S. Pat. No. 6,870,191 to Niki et al.

There are drawbacks in the prior art methods. In the context of the SEG and ELO methods, the layer is deposited through a seed window, or it is confined in a narrow channel. It often requires regrowth over multiple mask levels to block the dislocation defect. A single-step overgrowth is possible by growing the layers from a seed hole in a slit channel as described in U.S. Pat. No. 4,948,456 to Schubert et al. However, the layer growth through a slit is less predictable due to the difficulty of fast switching of source nutrients within the narrow space confined in the channel. Moreover, the build up of thermal stress in the overgrowing layer that adheres intimately to the mask would cause layer distortion and generation of extra defects. In the context of the PSS method, a dry etching or a wet etching process has been frequently employed to form patterns on the surface of a substrate wafer, e.g., a sapphire substrate wafer for the growth of a GaN LED. However, it remains a challenge to maintain a uniform etching profile across the substrate surface. The situation gets worse as the wafer size increases.

SUMMARY OF THE INVENTION

The present light emitting device can overcome aforementioned deficiencies. The present invention may include one or more of the following advantages. The adverse influence of the substrate on device performance is reduced in the present device. The defect level is lower and there is a less chance for stress and heat to build up in the device structure. The light absorption loss is less and the extraction efficiency is improved in the present device. The present device may be processed without damaging the device layer. The light emitting structure may be configured in a pattern for desirable beam profile of the present device. The burden of resorting to sophisticated lens design to match the optics of the luminaries may be relaxed. The present device may emit lights in multiple colors. The present device may generate a white light emission for use in general lighting and display systems.

One objective of the present invention relates in general to defect reduction in device. In specific, to reduce dislocation defects in LED device due to lattice mismatch between layer and the substrate. Another objective of the present invention relates in general to the shaping of the beam profile of the LED device. In specific, beam shaping is realized by forming the LED structure in a pattern rather than etching the chip. A further objective of the present invention relates in general to a high efficiency LED that may be manufactured in a manner more compatible with the established cost-effective processing and packaging methods for large size wafers from the IC industry. This would further reduce the cost of ownership ($/lumen) in LED systems for lighting and display backlight applications.

In one general aspect, the present invention relates to a light-emitting device that includes a light emitting structure comprising a lower layer of the first conductivity type, an active layer, an upper layer of the second conductivity type; a first electrode connected to the lower layer of the first conductivity type; a second electrode connected to the upper layer of the second conductivity type. In one embodiment, the light emitting structure is formed using a shell member, which comprises a planar portion and a shell portion. There is an opening in the shell portion. The layer deposition mainly commences from the within the shell portion while it is substantially suppressed elsewhere. The layer in the present device mainly forms a peripheral contact with the shell in the thickness direction. Direct contact of the layer to the shell member is limited and the chance for thermal stress to build up is reduced. The light emitting structure may link to the substrate through narrow sections. This would reduce the adverse influence of the substrate. There is a less chance for the thermal and mechanical stresses to build up in the layer. The chance for crystalline defects such as misfit dislocations to propagate into the device layer is reduced. In another embodiment, the device further comprises a growth suppression zone in the shell member. The device may be in the architecture of a pixel LED chip, a singular LED pixel, an assorted LED or the like. The light emitting structure may reside over the shell member, or in the shell member forming light emitting segments. The shell member may comprise a dielectric, metal, cavity, and combinations thereof. The shell member may assume the shape of a dome, a box, a cone and the like. There is little impedance for the gas to flow in the shell in the present device. The present shell is structurally more self-supportive and more stable at high temperatures. The openings may be of a variety of size and shape at different locations in shell. The opening may be formed away from shell top. In another embodiment, the device may have a plurality of gaps in the structure abutting the shell member. A portion of the lighting emitting structure may be raised due to the presence of the gaps. The gaps near the substrate interface may create a breathing space for the layer structure to expand and contract upon heating and cooling. The excessive stress may be quickly dispersed and damped before building up its strength. The chance for the excessive stress to build up in the wafer is reduced. This would help to prevent the crystalline defects from occurring in the first place. A significant portion of crystalline defect is stranded in the shell while the defect level in the active region is reduced. Using the shell member as a building block, the present light emitting device may be readily fabricated in various architectures. The shell geometry and the gaps in the present device may further contribute to an enhanced light reflection in omni directions. It may also allow for the use of an absorbing substrate, e.g., silicon substrate to further reduce the cost. The shell may be also substantially asymmetrical in shape. The light emission from the active region may be deliberately redirected when impinging upon the asymmetrical shell. By adjusting the orientation and tilt of the shell, a more delicate beam profile may be created in the present device. The present LED device may be further integrated into an LED module. Each component LED may radiate towards an assigned azimuth. The beam profile of the LED module in the present invention thus may be shaped into a desirable pattern to suit different applications. In another embodiment, the light emitting structure may comprise a plurality of active regions. The active regions may emit lights having a dominant radiation in different wavelength region of the spectrum. The lights may be intimately color mixed to generate light emission of the present device. By choosing active regions that emit lights in complementary colors, the present device may deliver a white light emission perceived to the naked eye. A portion of shell may be opened to expose the layers in the shell for electrical connections. In another embodiment, the device may comprise a plurality of emitter pixels formed using the shell member. The shell member may be substantially reflective in the spectral region of interest selected from UV, visible, and infrared to enhance directional beam output of the present device. In another embodiment, the present device may comprise a suspended shell member, where layer growth in shell may extend into a conduit connecting the shells. In another embodiment, the present device may comprise a compound shell member having coupled, stacked, or spaced shells. The dislocation defects may be substantially detained in the lower shell, while the upper shell is used for forming LED structure. In the present device, the narrow sections linking the layer structure to the substrate does not scale up appreciably as chip size increases. The present device is advantageous over the prior art devices in making devices having a large luminance area. In another embodiment, the present device may comprise light emitting segments e.g. stripes, disks, rings; or may have discontinuities, e.g. open pits, embedded holes in the light emitting structure. The present device may further comprise a plural stack of cavity structures. The escaping dislocation defects from one cavity layer are herded to and detained by another stack of cavity layer. In another embodiment, the shell member and the LED structure may be formed on a structured substrate surface. The present device may further comprise light emitting segments in the valley of the structured substrate surface. The present device may further comprise a wafer-level-package (WLP) having conductive feed through in the substrate for electrical connections. Thus the present device may be more compatible with the WLP process from the IC industry for further cost reduction.

In another general aspect, the present invention relates to a light-emitting device, that includes a light emitting structure comprising a lower layer of the first conductivity type, an active layer, an upper layer of the second conductivity type; an electrode connected to the lower layer of the first conductivity type; an electrode connected to the upper layer of the second conductivity type; wherein the light emitting structure is fabricated using a shell member that is configured in a pattern. The light emitting pixels and the light emitting structures on the shell member may be also configured in a pattern in the present device. The beam profile of the present device thus may form a desirable radiation pattern. In another embodiment, the shell member may further comprise multiple openings. The openings may be in different sizes and shapes, facing designated directions. In another embodiment, the light emitting structure may have sections of uneven sizes. Each section may emit a light having dominant wavelength in different spectral region. The lights may be color mixed to generate a white light emission in the present device. In another embodiment, the present device may have discontinuities in the light emitting structure comprising, e.g. pits or gaps, a mesh or a web having grids and holes. The output beam of the device may be shaped into a desirable pattern.

Implementations of the system may include one or more of the following. The shell may be a dielectric material, a metal, a cavity, and combinations thereof. The light emitting structure can include materials selected from the group of III-V, II-VI semiconductor materials. The substrate can be selected from the group comprising group III-V, group IV, group II-VI elements and alloys, ZnO, spinel and sapphire. A simplified process route of the present device may include the following. A resist mask is formed on substrate surface and reflowed into a lens shape. A SiO2 film is CVD deposited over the surface and etched open using conventional photolithographic methods. The resist is then stripped off and a shell member, e.g. in the shape of a dome, is formed. After cleaning and baking, the wafer is transferred into an MOVPE growth chamber for layer deposition. The growth commences from within the shell member till it reaches the opening and exits to the outside. The layer then grows over the shell and may converge into a film for depositing the LED structure. The wafer is then unloaded from the growth chamber and processed into operative devices. The present device may be mounted in a face-up or a flip-chip configuration in a conventional package. The present device may further comprise a phosphor material to generate a white light emission for use in general lighting and display systems.

The present invention will be best described in detail with reference to the figures listed and is described below. These figures are intended solely for illustrative purposes.

DETAILED DESCRIPTION OF THE INVENTION

Figure 1:
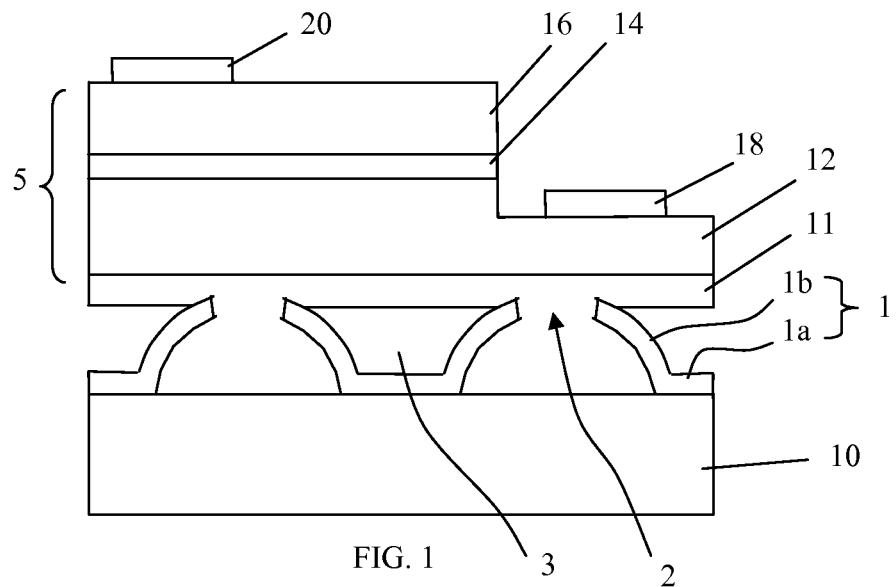
FIG. 1 is a simplified, cross-sectional view illustrating an LED formed using a shell member according to an embodiment of the present invention.

FIG. 1 is a simplified, cross sectional view of an illustrative example of a light emitting device in an embodiment of the present invention. The light emitting device may comprise a light emitting structure that is formed using layer deposition. In this example, light emitting structure 5 may comprise a lower layer of a first conductivity type 12, an active layer 14, an upper layer of a second conductivity type 16. The light emitting device may further comprise a first electrode 18 connected to the lower layer of a first conductivity type; a second electrode 20 connected to the upper layer of a second conductivity type. The light emitting structure 5 may comprise a variety of materials selected from the group comprising III-V materials, group II-VI semiconductor materials. Suitable substrates may include the group III-V, group IV elements or alloys, group II-VI, oxides such as ZnO, spinel, or sapphire. In the present device, light emitting structure 5 is formed using a shell member 1, which comprises a planar portion 1a and a shell portion 1b. There is an opening 2 in the shell portion 1b. The layer deposition mainly commences from within a space confined by shell portion of the shell member, while it is substantially suppressed elsewhere. The present device may further comprise a substrate that has a first surface. The planar portion 1a may substantially adhere to the first surface of a substrate 10. The first surface of substrate may be substantially occupied by the shell member. The present device may further comprise a base layer formed on the first surface of the substrate. The shell member may be formed on the base layer. To aid in a clear description of the device in the present invention, the shell portion of the shell member is frequently referred as "shell" hereinafter.

The population of the shell may vary from a sparse population where the shells are spaced apart by a wide planar portion, to a dense population where the shells may join leaving little or no space for the planar portion. In the latter case, for example, the shell member may comprise dimple-like depressions where the planar portion may occupy a space practically close to nil. The shell 1b may be regular or irregular in size and shape. It may assume a contour resembling that of a dome, a box, a cone, a truncated dome, a truncated cone, a saddle and the like. The shell may be truncated, e.g., sliced or chopped in a vertical, a horizontal, or a slant direction. The shell may be of sub-micron to over several microns in thickness, preferably around 0.1 micron to 2 microns, so long as the structural integrity sustains in the actual temperature range encountered during manufacturing. The shells may be deployed in a regular or an irregular pattern, e.g. a regular or an irregular array of dots or stripes in a planar layout. The contour of the shell may be smooth or rough having e.g., bends or kinks after processing. The cross sectional shape of the shell may be substantially linear or curved, symmetric or asymmetric. For example, it may resemble that of a rectangle, a triangle, a trapezoid, a parabola, a curve, a tidal wave and the like. The location of the opening in the shell and its shape may vary. For example, it may be substantially rounded in shape. The shells may comprise a variety of materials, for example, a dielectric material such as $SiO_2$, $SiN_x$, a metal such as W, Ir, Pt, Ag, Al, a cavity and combinations thereof.

In the present device, gas nutrients may diffuse through the opening 2 to nurture layer deposition in the shell. As the growth proceeds, a first layer 11 may fill up the space in the shell and may protrude from the shell through the opening 2. Once outside, the geometrical restraint is substantially relaxed and the layer may grow in both vertical and lateral directions. Since layer growth is slower on a more stable facet plane, the layer may evolve into a different shape, e.g. a truncated hexagon owning to its growth habit. The sidewall of the overgrowing layer may be vertical or inclined in cross section. Optionally first layer 11 may coalescence into a continuous film. A plurality of gaps 3 may form after layer deposition abutting the shell member. The gaps may have a contour substantially tracing in part that of the shell member of the device in present invention.

The light emitting structure 5 of the present device may be fabricated using the conventional methods such as metal organic vapor phase epitaxy (MOVPE) and hydride vapor phase epitaxy (HVPE). A GaN LED may be frequently referred here as an example for the purpose of illustration of the device in the present invention. In brief, a GaN LED structure is fabricated by growing an n-type GaN layer 12 as a lower layer of the first conductivity type on a sapphire substrate 10. An InGaN layer 14 or an InGaN/GaN quantum well is then deposited as the active layer, followed by a p-type GaN layer 16 as an upper layer of the second conductivity type. A buffer layer and an unintentionally doped GaN layer may be inserted to improve the layer quality. A stress release layer, e.g., a strained layer superlattice (SLS) may be inserted to reduce crack formation. The growth ambient may be switched to favor a lateral or a vertical layer deposition at different stages of growth as desired. For example, a higher growth temperature and a lower pressure may be chosen to favor growth in lateral directions and vice versa. A low growth rate and a high VIII ratio may also be adopted to facilitate rapid lateral growth and layer coalescence. Optionally a base layer (not shown in Drawing for clarity) may be disposed on the substrate and the shell element 5 is formed on the base layer.

After the LED structure 5 is complete, the wafer is unloaded from the growth chamber and processed into operative devices. Contact electrodes 18, 20 are formed connecting to the layer of the first conductivity type 12, and to the layer of the second conductivity type 16, respectively. The device is energized by drawing currents from an external power supply. For a GaN LED grown on a sapphire substrate, the layer is often dry etched through a Ni mask to expose a portion of the lower n-type GaN layer. Ti/Al and Ni/Au are then deposited as the n-type and p-type contact electrodes, respectively. The device may be attached in a face-up scheme to a lead frame package using Ag paste, or in a face-down scheme using AuSn eutectic alloy and Ag or Al based reflector. The present device may also form a thin-film LED device having contact electrodes placed on the opposite sides of the junction upon substrate removal. The present device may further comprise a light conversion material, e.g. a phosphor to generate a white light emission for use in lighting and display systems.

The present device may comprise a misfit system, where the lattice constant of the layer crystal is different from that of the substrate. For example, it may be AlN layer on sapphire, GaN on sapphire, GaN on Si, InGaP on GaAs, InGaAs on InP, or InP on Si for light emission between UV and infrared. The lattice mismatch would cause a build up of coherent strain energy in the layer. Beyond a critical thickness, the layer crystal lattice may relax to release the stress and crystalline defects such as misfit dislocations are generated. Since most of the misfit dislocation defects are formed in the early stage of layer deposition, a significant portion of crystalline defect is stranded in the shell and remains substantially stagnant in the subsequent layer growth. In the prior SEG and ELO methods, the layer adheres intimately to the mask. The layer may bend or tilt due to stresses from different thermal expansion of the layer to that of the mask and the substrate wafer. This often causes excessive wafer warp and bow when cooling down from the growth temperature. It would create further complications when the wafer is processed into discrete devices. In contrast, the layer in the present device mainly forms a peripheral contact with the shell in the thickness direction. Direct contact of the layer to the shell member is limited and the chance for thermal stress to build up is less. The stress may be further relaxed when the shell member comprises a cavity. Moreover, a significant portion of the light emitting structure 5 may be raised due to the presence of the gaps 3 in the present device. This may be illustrated from an intuitive estimation of the sheet space occupied by the gaps. In a square plate containing 3×3 regular shells, for example, the volume would be $(4\pi r^3/3)(9/2)$ for the shell portion and $r(6r)(6r)$ for the plate. A dense population is assumed in the calculation for a rounded dome-shell with a base radius r. The model predicts that near 48% of the plate volume is occupied by the gaps. In a more extreme case where seven dome-like shells are densely packed in a hexagonal plate, the gaps would still occupy near 38% of the plate volume. For shells spaced further apart, more space is consumed by the gap. This would lead to several attractive characteristics of the present device. Instead of forming a broad contact, the light emitting structure may be linked to the substrate 10 through narrow sections defined by the shell member. The gaps near the substrate interface may create a breathing space for the layer structure to expand and contract upon heating and cooling. The excessive stress may be quickly dispersed and damped before building up its strength. The chance for the excessive stress to build up in the wafer is reduced. This would help to prevent the crystalline defects from occurring in the first place. The adverse influence of the substrate on the layer quality is effectively reduced. Compared with the prior art devices using SEG and ELO methods, the device performance may be further improved in the present device. These benefits are significant, unique and unexpected for one skilled in the field using the conventional LED design.

Optionally the shell member 1 may be substantially reflective in the spectral region of interest selected from UV, visible, and infrared. For example, the shell member may comprise a dielectric mirror stack, a metal such as Al and Ag, an air gap, and the combination thereof. Since most of the defects are confined within the shell, they are substantially shielded from entering the optical path of the light emission. The absorption loss by the defects is thus reduced in the present device. In the prior art devices using lateral overgrowth or patterned substrate methods, a significant portion of useful light is absorbed and lost by the defective layer. This demonstrates another benefit of the device in the present invention. Furthermore, the shell may assume a general shape similar to that of a paraboloid. The directional beam output would be further enhanced in the present device.

Figure 2:
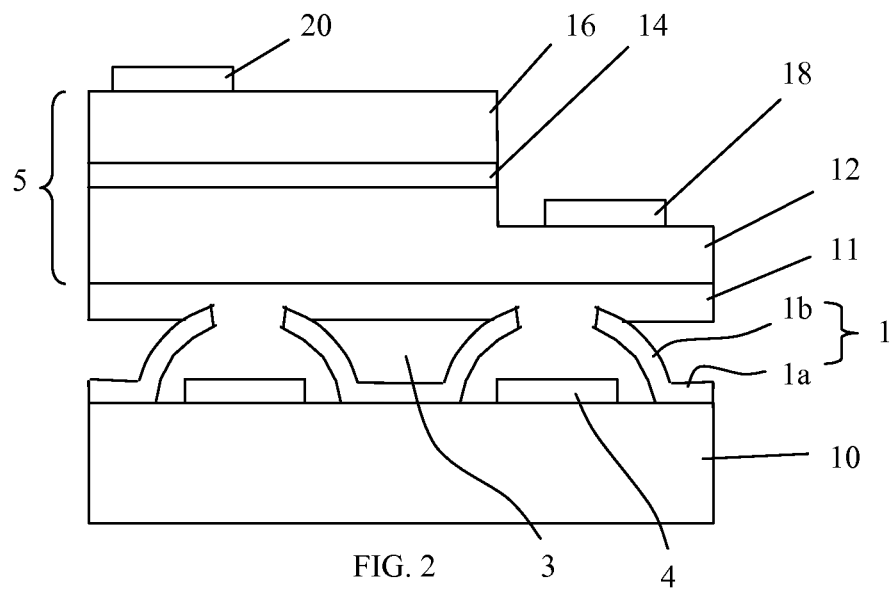
FIG. 2 is a simplified, cross-sectional view illustrating an LED that has a growth suppression zone in the shell according to another embodiment of the present invention.
Figure 3:
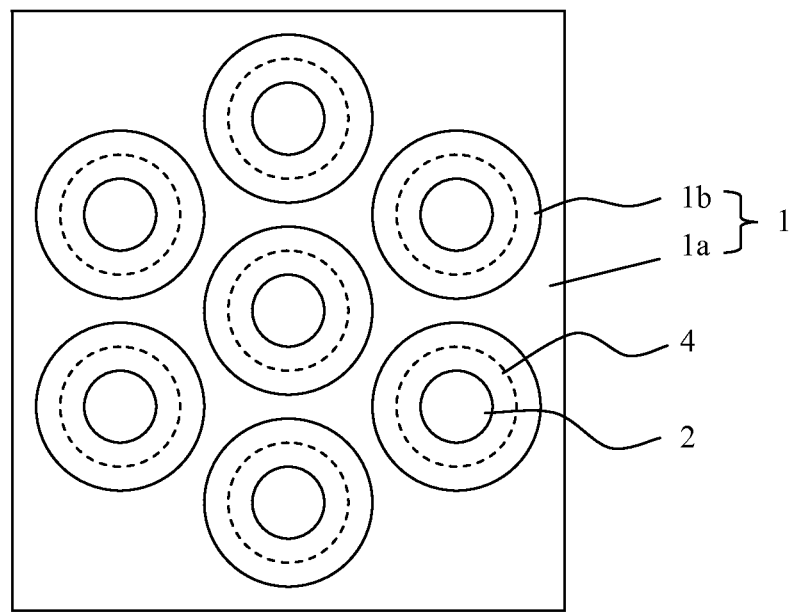
FIG. 3 is a simplified top view illustrating a shell member that has a growth suppression zone for making the LED device according to another embodiment of the present invention.

FIG. 2 is a simplified, cross sectional view of an illustrative example of the light emitting device in another embodiment of the present invention. In this example, the device further comprises a growth suppression zone 4 in the shell, where direct layer deposition on substrate is substantially suppressed. FIG. 3 is a simplified, top view illustrating an example of the growth suppression zone 4 in the shell. The growth suppression zone 4 may comprise a $SiN_x$ or a $SiO_2$ mask district formed using conventional photolithographic methods. Ion implantation may be also adopted to create crystal damage in the irradiated area where direct layer growth is suppressed. Typical implantation conditions are 10-30 KeV and a dosage of $10^{18}/cm^2$. Optionally the growth suppression zone 4 may be formed using the shell as a shadow mask for selective ion implantation. In this example, the growth commences from the substrate surface confined by the growth suppression zone 4 and the shell. The extent of dislocation defect in the layer emerging from the shell is further reduced. In the prior art devices, the growth zone is hidden at the far end of a channel for defect reduction. The extended channel may loose its structural integrity at the high temperature during GaN growth, which is typically above 1000° C. The gas nutrients must diffuse through a narrow channel before reaching the far end to nurture layer growth. Dead space may dwell in the channel causing incomplete gas switching. This would cause local variations in growth rate and premature clogging of the channel. In contrast, there is little impedance for the gas to flow in the shell in the present device. Moreover, the present shell is structurally more self-supportive and more stable at high temperatures. The drawbacks in the prior art device may be alleviated using the device in the present invention.

Figure 4A:
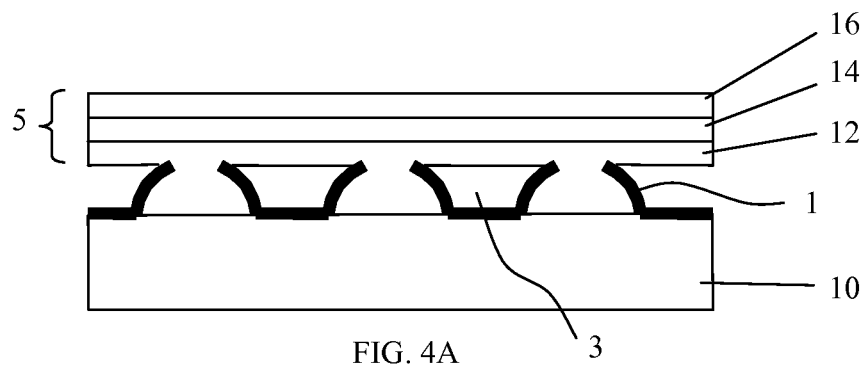
FIG. 4A-4F are simplified, illustrations of the LED device formed using a shell member according to another embodiment of the present invention. The contour of shell member is marked by the bold lines.

Using the shell member as a building block, the present light emitting device may be readily fabricated in various architectures. FIG. 4A is a simplified illustration of the device in another embodiment of the present invention. In this example, the light emitting structure 5 may reside on a plurality of shells on substrate surface. It may be substantially raised due to the presence of gaps 3 in the structure. A current injection scheme may be deployment in the lateral or vertical direction. Optionally the substrate, shell member, the prelayer such as undoped GaN layer and the defective layer may be removed and the light emitting structure is bonded to a carrier substrate. A thin film LED (TFLED) is obtained that has a lower defect density than the prior art devices. A reflective contact layer may be inserted to reduce the resistivity and the optical loss as described in U.S. Pat. No. 7,256,483 to Epler et al. Optionally a thick film, e.g. a GaN film may be also realized this way for use as a substrate to fabricate useful devices.

Figure 4B:
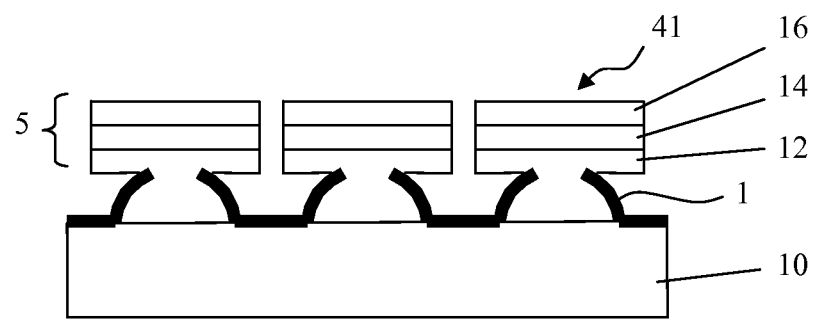
Figure 4C:
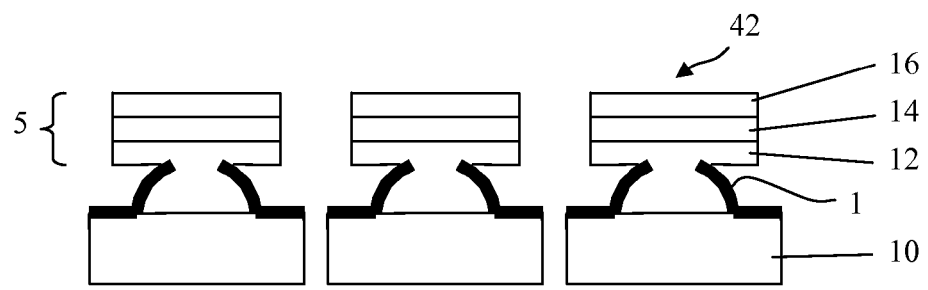
Figure 4D:
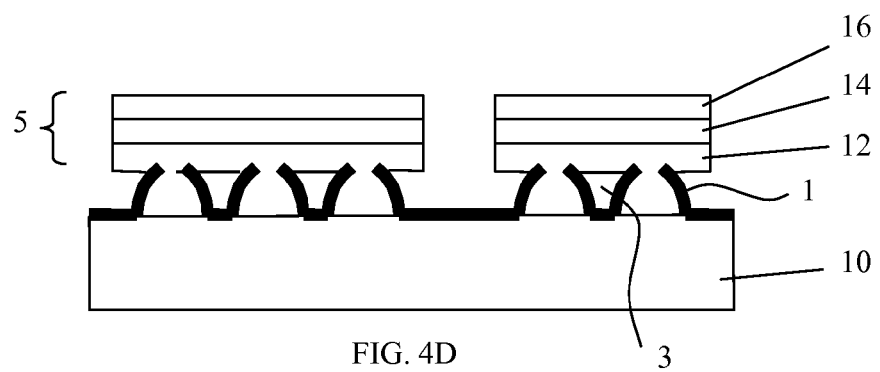

FIG. 4B is a simplified illustration of the device in another embodiment of the present invention. In this example, the present device further comprises a plurality of light emitting pixels 41 on the substrate 10. The light emitting pixels may be individually addressed to suit unique applications in, e.g., miniature display and high-speed data transmission. In another embodiment, the present device may comprise individual light-emitting pixel 42 as illustrated in FIG. 4C. In still another embodiment, the present device may comprise assorted groups of light emitting structures 5 on the substrate 10 as illustrated in FIG. 4D. The size and layout of the constituent groups may vary to harvest a desirable luminance pattern of the present device. The groups may be spaced apart such that layer coalescing mainly occurs within the group. By dicing the substrate through the clearance, the groups may be separated without harming the device layer. In contrast, processing of the conventional devices often requires sawing and dicing through the device layer which is prone to crack damages. The damage is overwhelming for smaller chips. It represents another benefit of the device in the present invention.

Figure 4E:
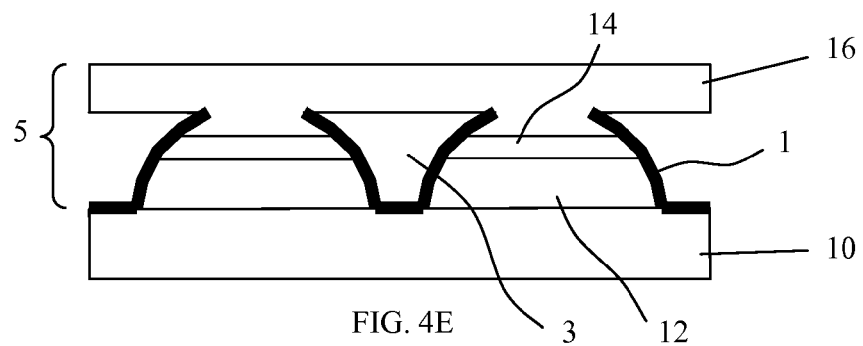
Figure 4F:
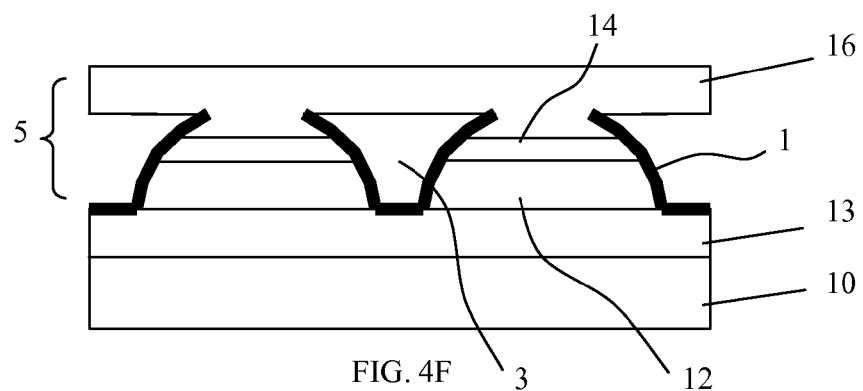

FIG. 4E is a simplified illustration of the device in another embodiment of the present invention. In this example, the light emitting structure 5 has gaps in the structure. The light emitting region may comprise light emitting segments, e.g., stripes or disks in the shell. The upper layer 16, e.g., a p-GaN layer may protrude from the shell and may coalesce into a film. Optionally the shell member may be formed on a base layer on the substrate. The light emitting segments thus fabricated are connected through the base layer 13, e.g. an n-type GaN layer as shown in FIG. 4F, which is a simplified illustration of the device in another embodiment of the present invention. Contact electrodes are then formed using the conventional methods. The present devices may be mounted face-up or face-down using Ag paste or die-attach resin, e.g., silicone, in a conventional package, e.g., lead frame (L/F) or chip-on-board (COB). The package may be further glued to a heat sink using a thermal interface material for heat dissipation. The shell member may be substantially transparent in the spectral wavelength region of interest to facilitate omnidirectional light output. To reduce reflection loss, the gap may be filled with an index matching material having an index between that of GaN and air, preferably near 1.55. It may be a phenyl-based silicone e.g. LPS-5547 from Shin-Etsu Chemical Co., Ltd., Tokyo, Japan, and SR-7010 from Dow Corning Corporation, Midland, Mich., USA. Optionally the shell member may be substantially reflective in the spectral wavelength region of interest, e.g., from UV to visible to enhance directional beam output of the present device.

Figure 5A:
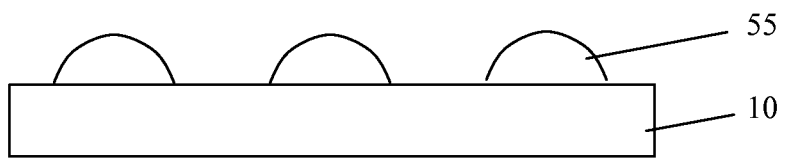
FIG. 5A-5I is a simplified, illustration of a process route of forming an LED using a shell member according to another embodiment of the present invention.
Figure 5B:
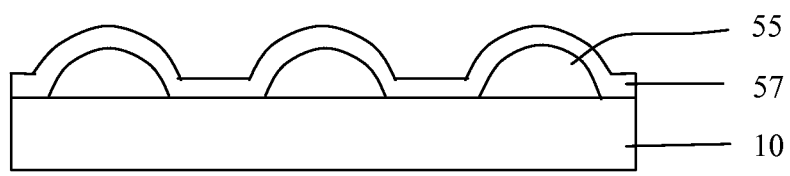
Figure 5C:
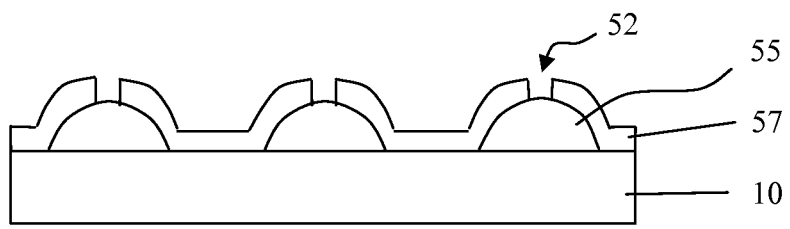
Figure 5D:
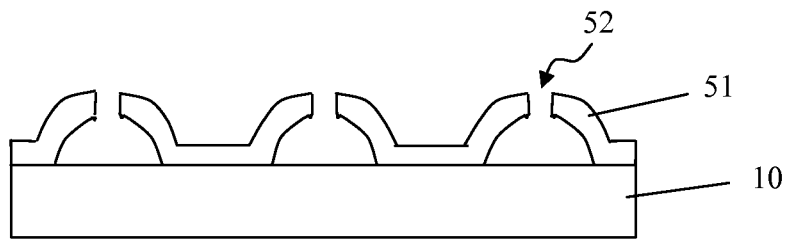

The present device may be manufactured in a manner that is more compatible with the established, cost-effective processes using large wafers from the IC industry. This would reduce the cost of ownership ($/lumen) of the LED system in applications such as general lighting and display backlight unit. FIG. 5A-5I are simplified illustrations of a process route of forming the present device. In brief, a resist mask 55 is formed on substrate 10 and reflowed into a dome shape (FIG. 5A). A $SiO_2$ film 57 is CVD deposited over the surface (FIG. 5B). An opening 52 is etched in $SiO_2$ film using conventional photolithographic methods (FIG. 5C). The resist is stripped off and the shell member 51 is formed (FIG. 5D). After cleaning and baking, the wafer is transferred into a growth chamber to grow the layers. In a GaN LED, for example, a buffer layer may be deposited at 500-800° C. in an MOCVD reactor to facilitate a smooth layer growth. The temperature is then raised to around 1050-1100° C. to grow the GaN layers. Typical source gases are trimethylgallium (TMI), trimethylindium (TMI), trimethylaluminium (TMA) for group III elements and ammonia for group V element. The layer may be doped with an impurity atom e.g. Si or Mg for n- or p-type conductivity, respectively. Details of the growth process have been described in U.S. Pat. No. 6,870,191 to Niki et al.

Figure 5E:
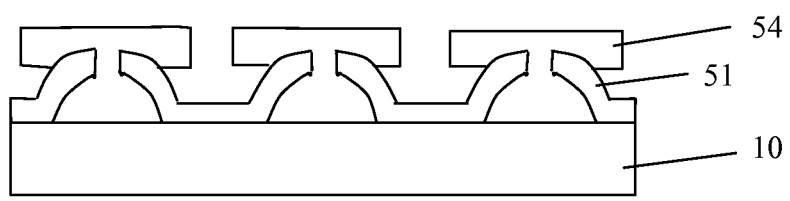
Figure 5F:
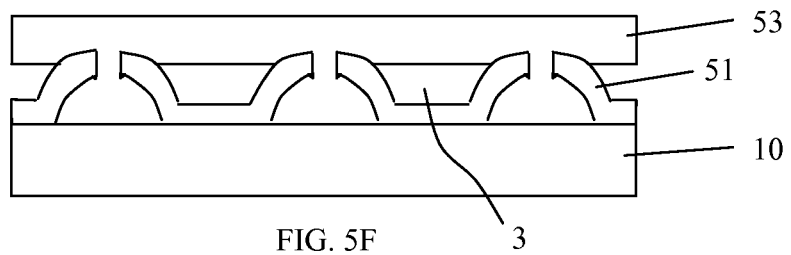
Figure 5G:
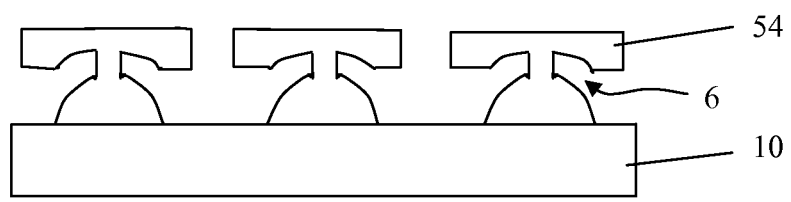
Figure 5H:
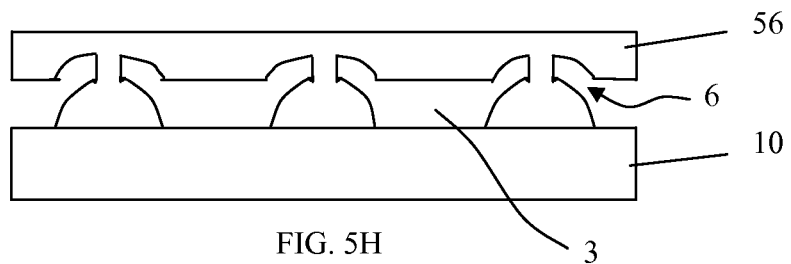
Figure 5I:
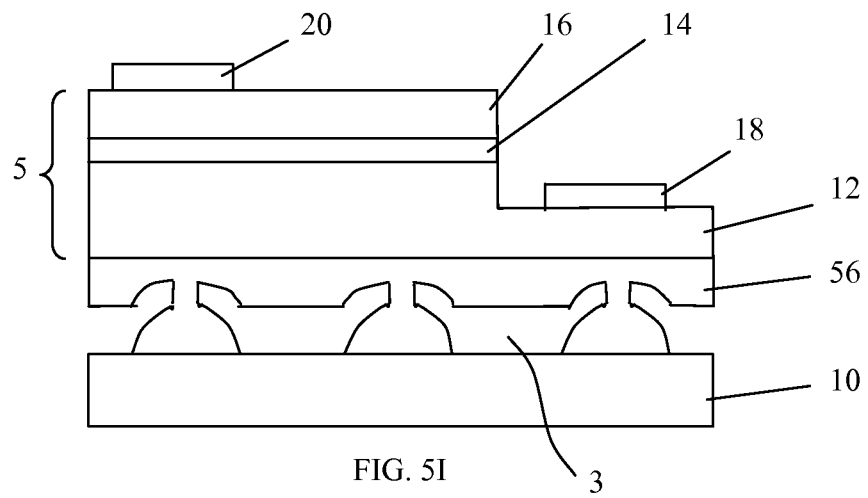

The layer deposition mainly commences from within the shell. The growing layer 54 may protrude from the shell (FIG. 5E). The layers may converge into a film 53 (FIG. 5F), which may be separated and processed into a substrate for device fabrication. The growth may continue to complete the LED structure 5 shown in FIG. 1. Optionally the growth may be posed after the layer protrudes from the shell (FIG. 5E). The wafer is removed from the growth chamber and dipped in a $HF/NH_4F$ solution. The shell member 51, e.g. $SiO_2$ is etched off forming a shell cavity 6 (FIG. 5G). The growth is resumed and the layer may coalesce into a film 56 (FIG. 5H). The subsequent layer growth over shell cavity does not rejuvenate the stranded dislocation defects. The growth may continue to complete the LED structure 5 as shown in FIG. 5I, which is a simplified, cross sectional view of an illustrative example of the device in another embodiment of the present invention. In this example, the shell cavity becomes a part of the gaps 3 in the present device.

While the shell member may be made reflective, the gaps in the present device may also act as an effective reflector. This is due to the large difference in refractive indices between GaN (n=2.4) and air (n=1). The defective area may be substantially shielded from the optical path of light emission from the LED structure. Moreover, the shell geometry and the gaps in the present device may further contribute to an enhanced light reflection in omni directions. There are important implications making the present device more attractive. For example, the absorption loss from total internal refection (TIR) in the prior art devices using a planar ELO mask or mirror is reduced. It may also allow for the use of an absorbing substrate, e.g., silicon substrate to reduce the cost. These benefits are significant, unique and unexpected for one skilled in the field using the conventional LED design.

Figure 6A:
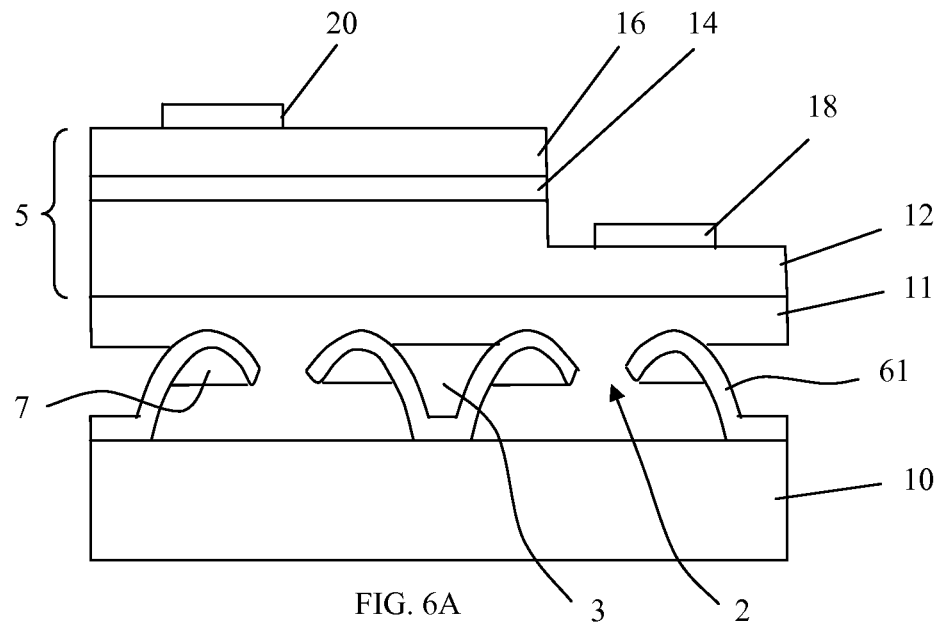
FIG. 6A is a simplified, cross-sectional view illustrating an LED formed using a shell member according to another embodiment of the present invention. The corresponding device comprising a shell cavity is illustrated in FIG. 6B.

FIG. 6A is a simplified, cross sectional view of an illustrative example of the light emitting device in another embodiment of the present invention. In this example, the opening is situated away from the shell top. The opening 2 may be formed in a depressed region in the shell. The shape of the shell may resemble that of a saddle. It may be formed using conventional photolithographic methods or using imprinting and embossing methods, which are frequently used to fabricate micro-machines (MEMS). As before, the layer deposition commences from within the shell 61. As the growth proceeds, however, the layer may protrude from the shell before filling up the shell. The inner space above the opening is left unfilled due to the starvation of source nutrients as the opening pinches off. A new set of gap 7 is formed in the shell 61 in the present device. An LED structure 5 is then formed after layer coalescing.

Figure 6B:
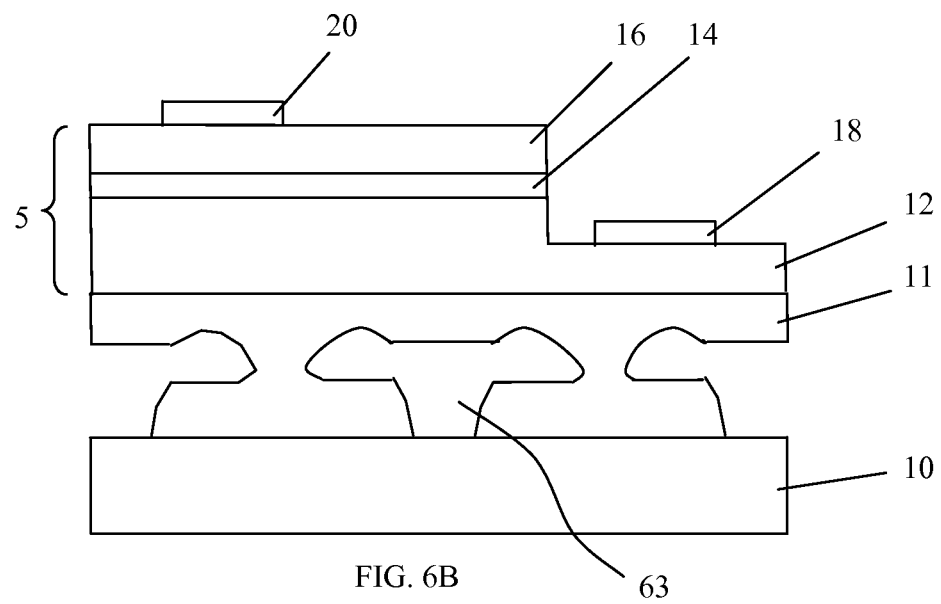

In the prior art ELO device, defect reduction is achieved by dislocation bending away from propagating upwards. A new situation arises in the present device. In specific, the misfit dislocations may find another chance to terminate at the free layer surface abutting the unfilled gap 7. A significant portion of the defects is segregated from the rest of the growth and the defect density in the device layer is further reduced. Moreover, the shell member is structurally more compliant due to the abundance of unfilled gaps. This facilitates stress relaxation while the layers are being disposed. The unfilled gap 7 and the shell member in the present device may act as a stress absorber for layer deposition. There is a less chance for thermal and mechanical stresses to build up in the wafer during the course of layer growth. These benefits are significant, unique and unexpected for one skilled in the field using the conventional LED design. FIG. 6B is a simplified, cross-sectional view illustrating the device according to another embodiment of the present invention. In this example, the shell member 61 is etched off forming a shell cavity, which becomes a part of the gaps 63 in the present device. The contour of gaps 63 may substantially trace in part that of shell member 61.

Figure 7A:
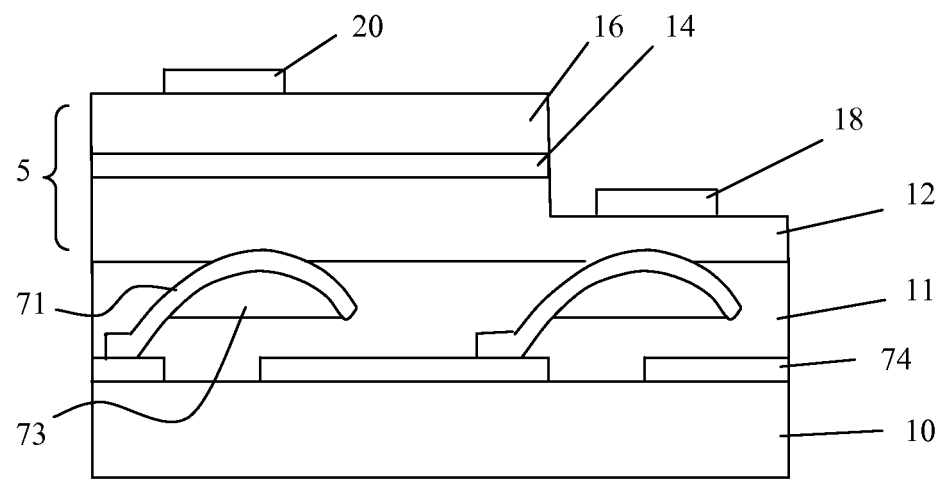
FIG. 7A is a simplified, cross-sectional view illustrating an LED formed using a tidal-wave shell member according to another embodiment of the present invention. The corresponding device comprising a shell cavity is illustrated in FIG. 7B.
Figure 7B:
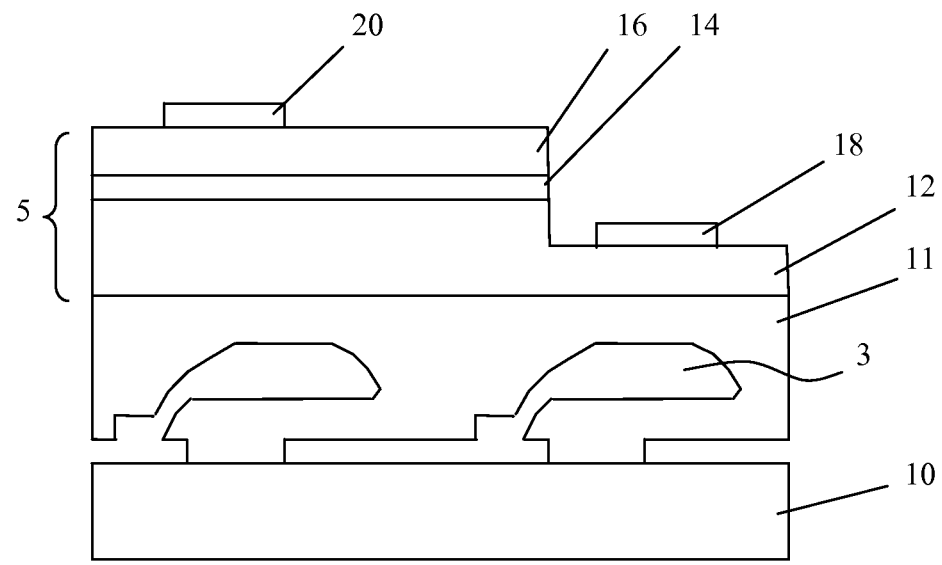
FIG. 7C illustrates a layout of LED devices in an LED module according to another embodiment of the present invention. Arrow indicates the possible main emission direction of the LED device.

FIG. 7A is a simplified, cross-sectional view illustrating an LED according to another embodiment of the present invention. In this example, the shell may be substantially asymmetrical in shape. The light emission from the active region may be deliberately redirected when impinging upon the asymmetrical shell. The shell may be, e.g., a chopped shell 71 in the shape of a tidal wave in cross section. Optionally the shell may be formed on a growth-suppression mask 74. An unfilled gap 73 may form in the inner space of the shell above the opening. The shell 71 and the growth suppression mask 74 may be etched off forming cavities before growing the light emitting structure 5. FIG. 7B is a simplified, cross-sectional view illustrating the device according to another embodiment of the present invention. There may be residue layer deposition in the gap (not shown in Drawing for clarity), which does not directly affect the results. The mask cavity and the shell cavity join and become a part of the gaps 3 abutting shell element in the present device. The shell member 71 and the mask 74 may be also removed upon optional substrate removal in subsequent processing of the device.

Figure 7C:
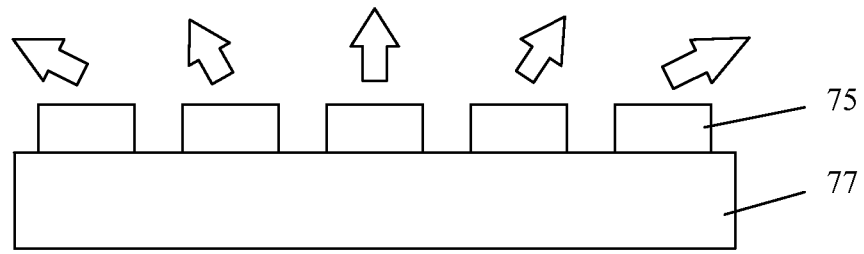

By adjusting the orientation and tilt of the shell, a more delicate beam profile may be created in the present device. The present LED device may be further integrated into an LED module, e.g., in a mosaic arrangement. Each component LED may radiate towards an assigned azimuth. This is shown in FIG. 7C, which is a simplified, schematic view illustrating an example of the LED module according to another embodiment of the present invention. The LED devices 75 may be attached to a printed circuit board (PCB) 77, e.g., a metal core PCB (MCPCB). In this example, the center LED may emit substantially upwards while the side LED emits mainly into a different azimuth. The arrow in the figure shows the possible main emission direction of the LED device. The center LED may be formed using a symmetrical shell while the side LED may be formed using an unsymmetrical shell. This way the light intensity may be allocated in a desirable pattern along the azimuth. The beam profile of the LED module in the present invention thus may be shaped into a desirable pattern to suit different applications. The radiation pattern may resemble that of a Lambertian distribution for a point light source. Optionally it may be a non-Lambertian distribution without using an aspherical lens. For example, it may resemble that of a batwing emitter for street and signal lighting, a side emitter for signs and backlights in LCD displays, or a narrow angle emitter for spot illumination. In the prior art devices, a sophisticated lens optics is often used to shape the beam profile. These benefits are significant, unique and unexpected for one skilled in the field using the conventional LED design.

The present device may be mounted in a conventional face up or a face down configuration. Optionally the substrate may be removed to form a thin-film LED device. In an InGaN LED, for example, a reflective contact layer of ITO/AgCu is formed on the p-GaN layer followed by a Ti/Cu layer. The wafer is then bonded to a carrier wafer such as a Ti/Au coated p-type Si or CuW using a AuSn alloy by thermal compression at 300° C. The wafer is exposed to a 248 nm KrF excimer laser through the sapphire substrate. The interfacial GaN is decomposed and the layer separated from the substrate wafer. After dipping in an HCl solution to remove Ga droplets, the wafer may be dry etched or kiss polished to expose the n-GaN layer. An n-contact layer, e.g. Cr/Al/Ti/Au is formed on n-GaN layer and a p-contact, e.g. Ti/Au is formed on the backside of the p-type Si wafer. The detailed fabrication process has been described by Jeong et el., in Electrochemical and solid State Letters (13) H237-H239, 2010. The devices are probe tested and diced into chips. The device layer may be severed from the substrate wafer by applying a shear force due to the gaps near the substrate interface. This represents another benefit of the device in the present invention.

In some occasions, there may be light emission from the layers deposited on the sidewall of the structure (not shown in Drawings for clarity). Color mixing of the light emission from top and from the side would produce a polychromatic output of the device. Optionally the sidewall emission may be suppressed by using selectively ion implanted. It is also known that the layer growth on top may prevail over that on the sidewall. The active layer, e.g. an InGaN quantum well on sidewall may become thinner in thickness and low in In concentration. This has been described by Kim et al., in Phys. Stat. Sol. (c) No. 6, 2001-2003 (2008). The sidewall may become an energy barrier and most of the carriers are confined in the top layer. The sidewall may also act as a window layer to light emission from top owning to its higher transition energy. It is also known that the Mg atom does not incorporate well on sidewall facets. In a GaN LED, the p-GaN layer on sidewall may remain resistive even after annealing treatment. This has been described by Ren et al., in Appl. Phys. Lett. (86), 121901 (2005). Only the top p-GaN layer, which has a higher Mg concentration, is able to generate sufficient holes for current injection. This facilitates a dominant light emission from top of the light emitting structure under normal bias conditions in the present device.

Figure 8:
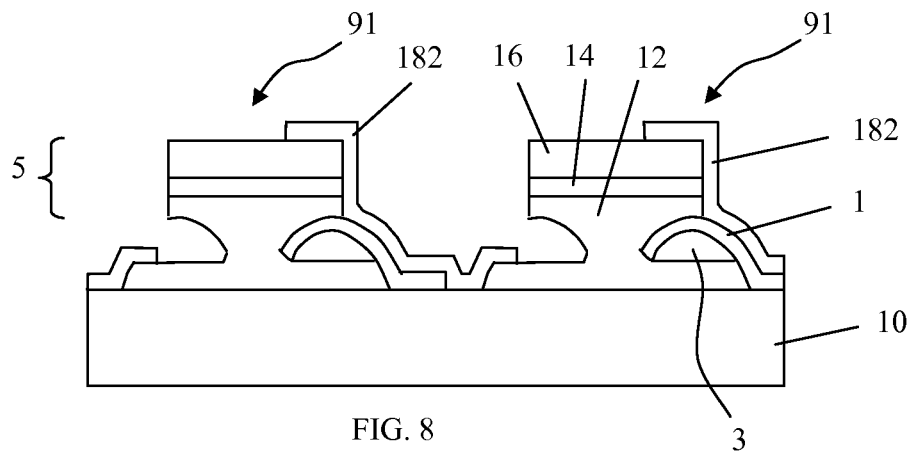
FIG. 8 is a simplified, cross-sectional view illustrating a scheme of forming series connection to the light emitting pixels according to another embodiment of the present invention.

In the present device, contact electrodes may be formed in the street between light emitting pixels. For example, the shell may be partially etched open to make electrical connection to the low layer in the shell. The remaining shell may be used for electrical connections to the top layer. Example of the contact schemes through the micro-pixels has been described in U.S. Pat. No. 6,410,940 to Jiang et al. Optionally the pixels may be connected in series. FIG. 8 is a simplified, cross-sectional view illustrating an LED according to another embodiment of the present invention. In this example, the light emitting pixels 91 are interconnected through the contacts of opposite polarity. In this embodiment, the electrodes 18 and 20 are placed away from the main optical path of the light emission from the active region. This is beneficial over the conventional LED wherein a portion of useful light is blocked and lost by top electrode.

Figure 9A:
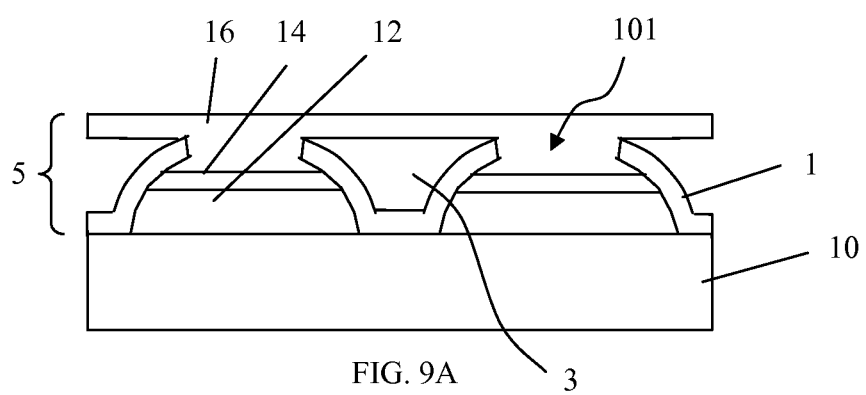
FIG. 9A-9D are simplified, cross-sectional views illustrating formation of an LED device that has light emitting segments according to another embodiment of the present invention.
Figure 9B:
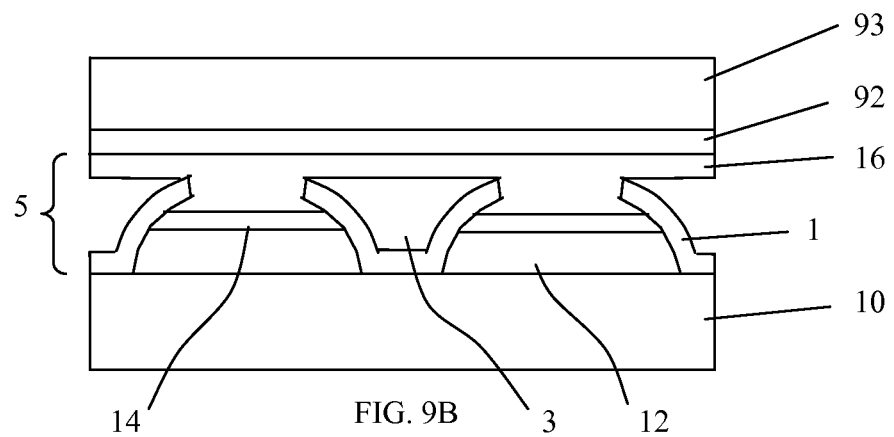
Figure 9C:
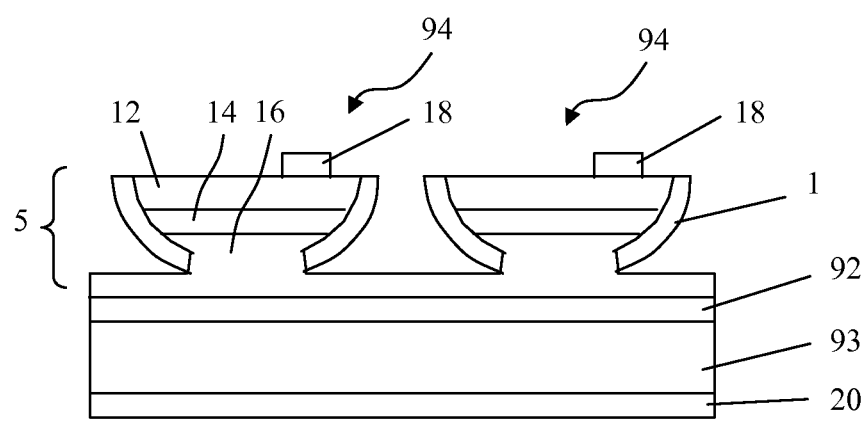
Figure 9D:
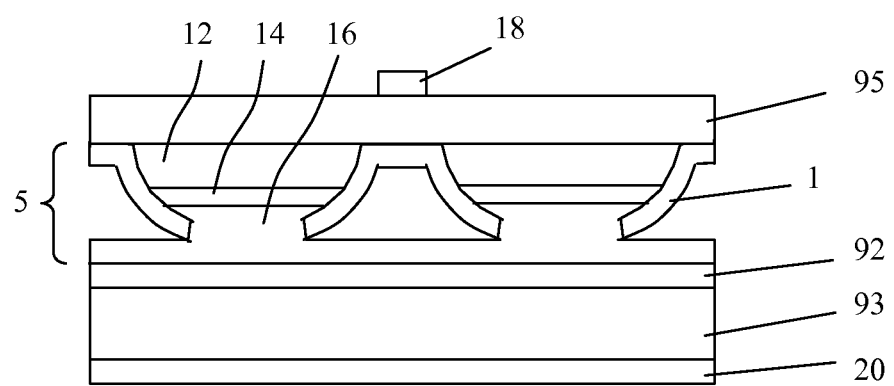

FIG. 9A is a simplified, cross-sectional view illustrating an LED according to another embodiment of the present invention. In this example, the light emitting structure 5 may grow substantially in the shell forming light emitting segments 101. Optionally the upper layer, e.g., p-type layer 16 may grow over the shell and merges into a film. A contact layer may be formed and the structure is bonded to a carrier substrate 93 using an alloy such as AuSn 92, as illustrated in FIG. 9B. The carrier substrate may be a conductor, e.g. a metal such as CuW or a semiconductor, e.g. Si. The substrate, pre-layer and defective region may be also removed, forming light emitting segments, e.g., stripes or pixels 94 on carrier substrate 93. This is shown in FIG. 9C, which is a simplified, cross-sectional view illustrating an LED according to another embodiment of the present invention. In this example, the present device may comprise a carrier substrate 93, a bonding layer 92 on the carrier substrate, a contact layer on said bonding layer to reduce the contact resistivity (not shown in Drawing for clarity), a light emitting structure 5 on the contact layer comprising a layer of the a second conductivity type 16, an active layer 14, a layer of the first conductivity type 12, contact electrodes 18, 20 connected to the layer of the first conductivity type 12 and to the carrier substrate 93, respectively, forming a current injection scheme. The light emitting structure may comprise light emitting segments disposed substantially in the shell portion that has an opening. The shell portion may have a contour resembling that of a dome, a box, a cone, a paraboloid, a truncated dome, a truncated cone, a truncated paraboloid, a saddle and the like in an inverted configuration. Optionally a base layer 95 may form on the substrate 10 and the shell portion is formed on the base layer. The layer of the first conductivity type, e.g., n-type GaN layer may become also interconnected. An n-contact electrode 18 is readily deployed to present device as illustrated in FIG. 9D. The shell portion and the contact layer may be substantially reflective in the spectral region of interest selected from UV, visible, and infrared to enhance directional beam output of the present device. In the prior art devices, the emitter is formed by etching through the active layer as described in U.S. Pat. No. 6,995,030 to Illek et al., and in U.S. Pat. No. 7,598,149 to Dawson et al. For example, a light emitting structure is first grown on a substrate. The layer structure is etched through a mask district to form mesas, followed by bonding to a carrier wafer and removal of the growth substrate. Since the light emitting structure is formed directly on the substrate, there is no avenue for defect reduction. In contrast, the light emitting pixels are formed using the shell member in the present device. The defect extent is low and the active region is not substantially etched. These benefits are significant, unique and unexpected for one skilled in the field using the conventional LED design.

Figure 10A:
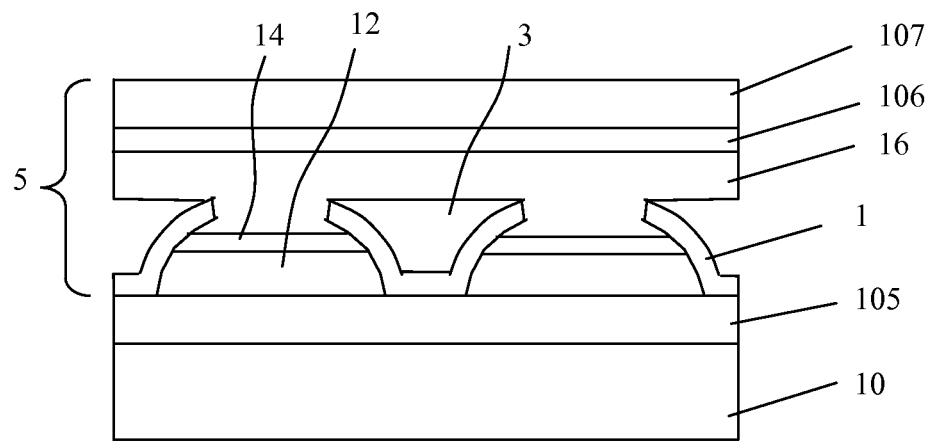
FIG. 10A is a simplified, cross-sectional view illustrating an LED device having plural active regions according to another embodiment of the present invention.
Figure 10B:
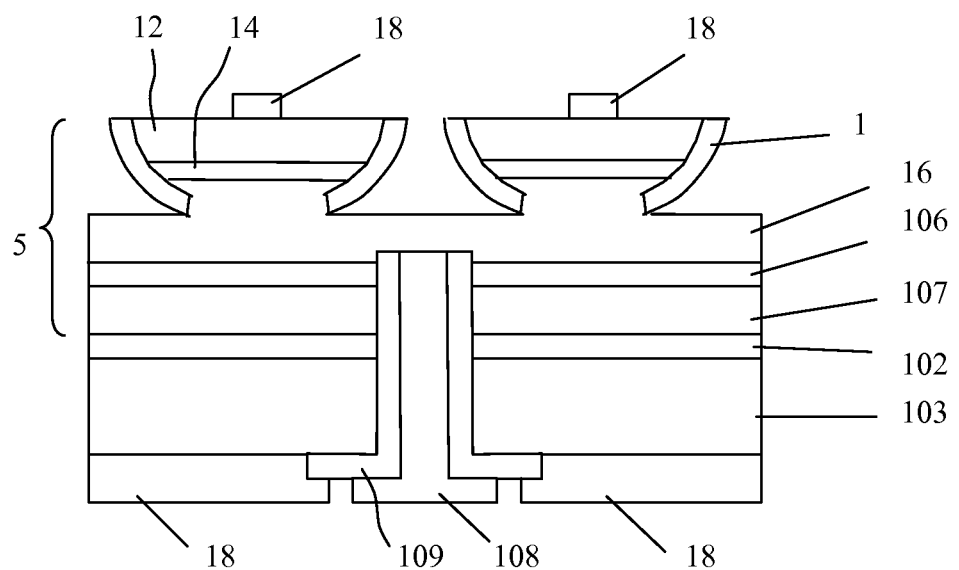
FIG. 10B is a simplified, cross-sectional view illustrating an LED device having conductive feed through in the carrier substrate.

Optionally the light emitting structure may have a plurality of active regions. FIG. 10A is a simplified, cross-sectional view illustrating an LED according to another embodiment of the present invention. In this example, the light emitting structure 5 may comprise plural active regions, e.g., an active region 14 in the shell and another active region 106 out of the shell. Contact electrodes with a proper insulation (not shown in Drawing for clarity) may be connected to n-layer 12, p-layer 16, and the upper n-layer 107, respectively, to inject currents through both p-n junctions from an external power supply. Optionally the light emitting structure may be bonded to a carrier wafer 103 e.g. Si or CuW followed by removal of the growth substrate 10. FIG. 10B is a simplified, cross-sectional view illustrating an LED according to another embodiment of the present invention. In this example, electrical connections to the p-layer 16 may be formed using a conductive feed through 108 drilled in the thinned substrate 103. It may be a Cu-plated feed through with a proper isolation 109 e.g., $SiO_2$ to avoid short circuit to the device structure. N-contact electrodes 18 may be formed connecting to the top n-layer 12 and to the carrier wafer 103, respectively. The active regions 14 and 106 may emit lights having different dominant radiations in the spectral region of interest selected from UV, visible, and infrared. The lights may be intimately color mixed to generate light emission of the present device. By choosing active regions that emit lights in complementary colors, the present device may deliver a white light emission perceived to the naked eye. Compared with the prior art white light LED that uses a light conversion material such as a phosphor, the optical loss in light conversion is substantially alleviated in the present device. These benefits are significant, unique and unexpected for one skilled in the field using the conventional LED design.

Figure 11:
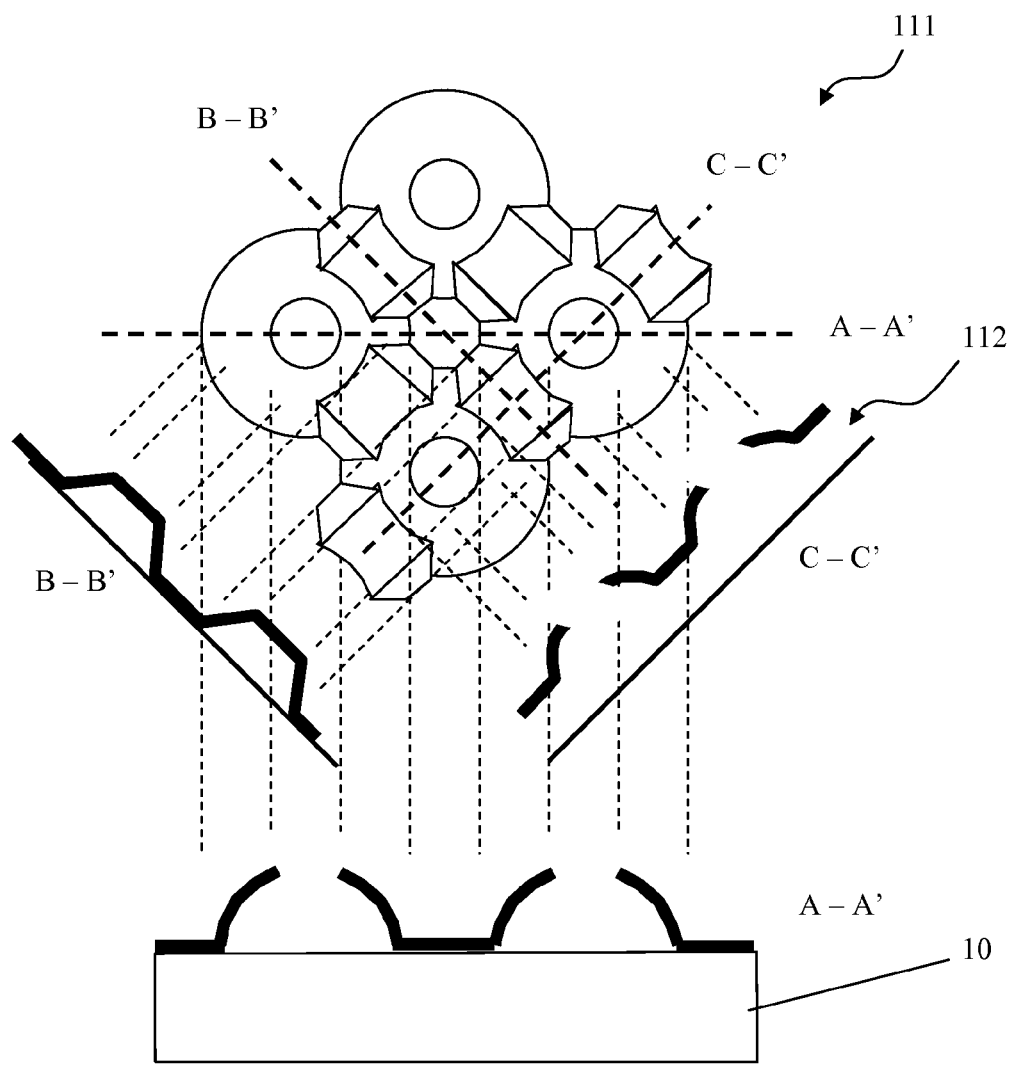
FIG. 11 is a simplified illustration of the contours of a suspension shell member for making the LED device according to another embodiment of the present invention. The contour of shell member is marked by the bold lines.

FIG. 11 is a simplified illustration of a suspension shell member for fabricating the device according to another embodiment of the present invention. In this example, a portion of the shell member C-C' is suspended over an air bridge B-B' connecting the neighboring shells. The suspension shell member 111 may be formed using imprinting methods. For example, a mother mold is machined to shape. A resin is then poured into the mold, cured then released to form a negative rubber stamp. The pattern is imprint transferred to a resist film on the substrate surface. After gentle plasma cleaning, a PECVD $SiO_2$ film is deposited and openings are defined in the shell. After stripping off the resist, the wafer is cleaned ready for layer deposition. A growth suppression zone may be also formed in the shell as described before. The layer growing in the shell may extend into the conduits 112 under the air bridge B-B' and become interconnected. Alternatively base layer, e.g., an n-GaN layer is formed on substrate surface and the shell member is formed on the base layer. The layer in the shell member may be also connected through the base layer. This forms a convenient pathway for current injection across the shell member in the present device.

Figure 12A:
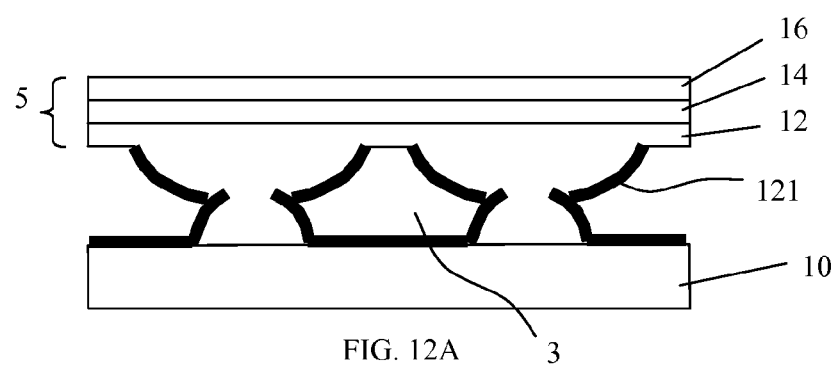
FIG. 12A-12F are simplified, cross-sectional views illustrating an LED device formed using a compound shell member according to another embodiment of the present invention. The contour of shell member is marked by the bold lines.
Figure 12B:
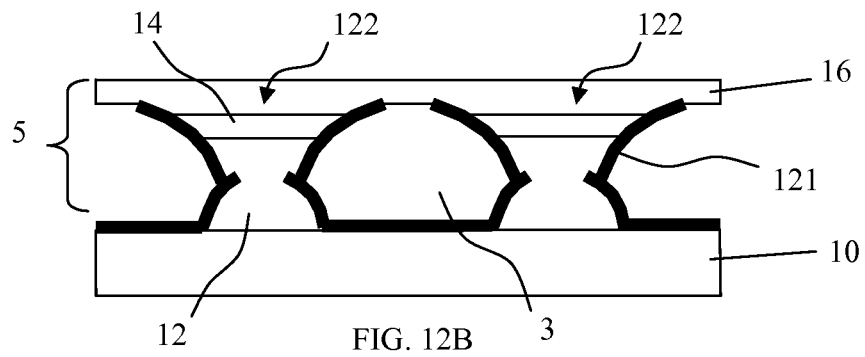
Figure 12C:
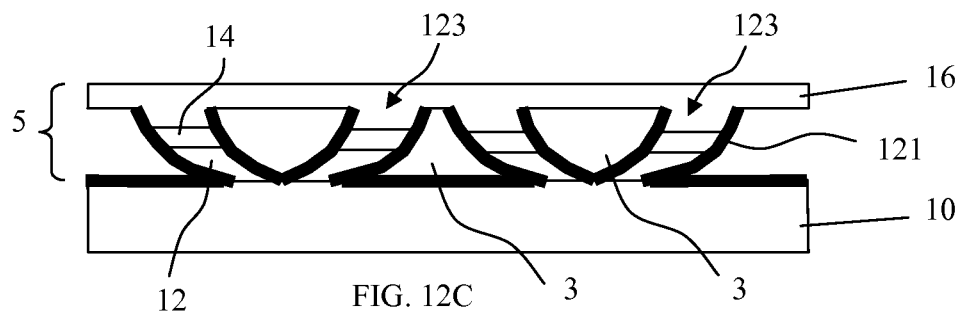
Figure 12D:
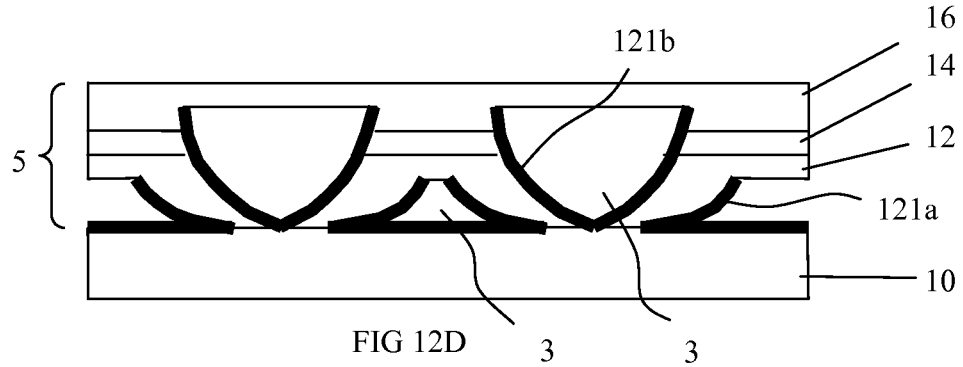
Figure 12E:
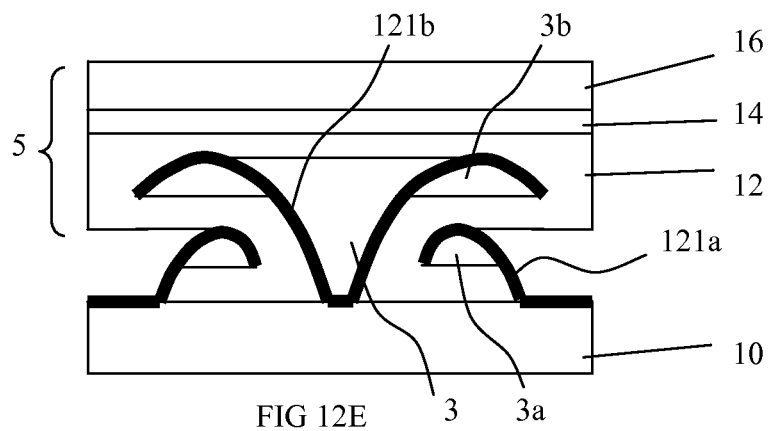
Figure 12F:
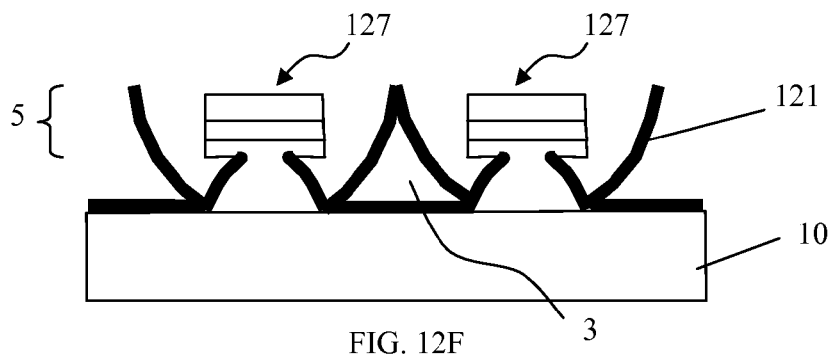

Using the present methods, a compound shell member may be formed having more than one set of shells. The shells may be compiled in a substantially stacked, spaced, coupled, branched, or entwined geometry. FIG. 12A is a simplified, cross-sectional view illustrating an LED according to another embodiment of the present invention. In this example, the shells may be stacked forming a waist in the compound shell member 121. The lower shell may be mainly for defect detention while the upper shell for forming the light emitting structure. Optionally the active region may reside in the upper shell forming light emitting segments 122 in the shape of e.g., a stripe or a disk as illustrated in FIG. 12B. The active region may also reside between the shells forming light emitting segments 123 in the shape of e.g., a ring as illustrated in FIG. 12C. The shells 121a and 121b may be different in size and in shape as illustrated in FIG. 12D. In this example, the layer growing over the outer shell member is chopped by the inner shell member. Gaps or holes 3 may form in the light emitting structure 5. Optionally the shells 121a and 121b may be entwined. The present device may further comprise plural stacks of gaps abutting the shell member as illustrated in FIG. 12E. The escaping crystalline defects such as misfit dislocation defects from gap 3a are shepherd to and substantially detained in another stack of gap 3b. More dislocation defects may be filtered out before reaching the active region of the present device. Optionally the LED structure 5 may reside in the shell forming an emitter array 127 as illustrated in FIG. 12F. The shell member may be substantially reflective to enhance the directional beam output of the present device. In the present device, the bottle neck or the narrow section linking the layer structure to the substrate does not scale up appreciably as chip size increases. The chance for defects leaking out of the shell is low. The present device is advantageous over the prior art devices in making devices having a large luminance area.

Figure 13A:
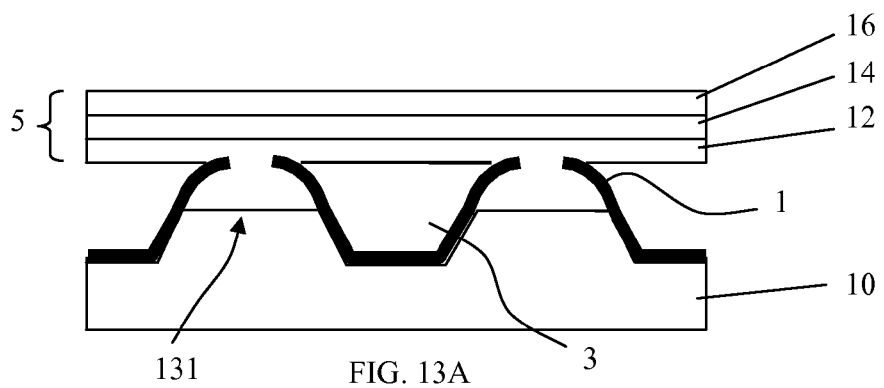
FIG. 13A-13D are simplified, cross-sectional and top views illustrating an LED device that has a shell member on a structured substrate surface according to another embodiment of the present invention. The contour of shell members is marked by the bold lines.
Figure 13B:
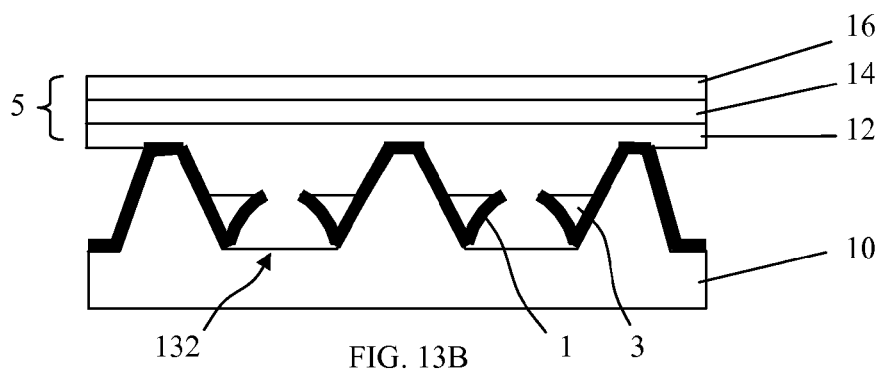
Figure 13C:
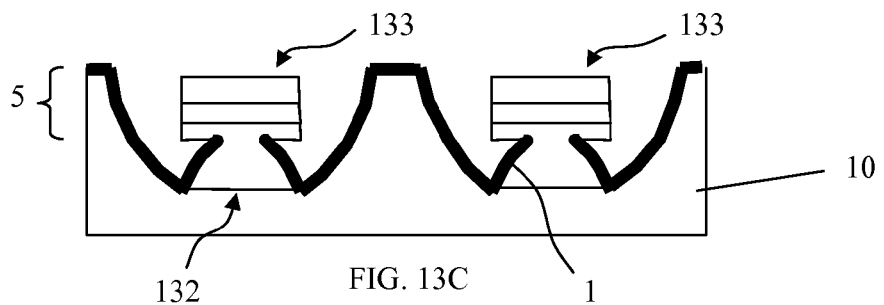
Figure 13D:
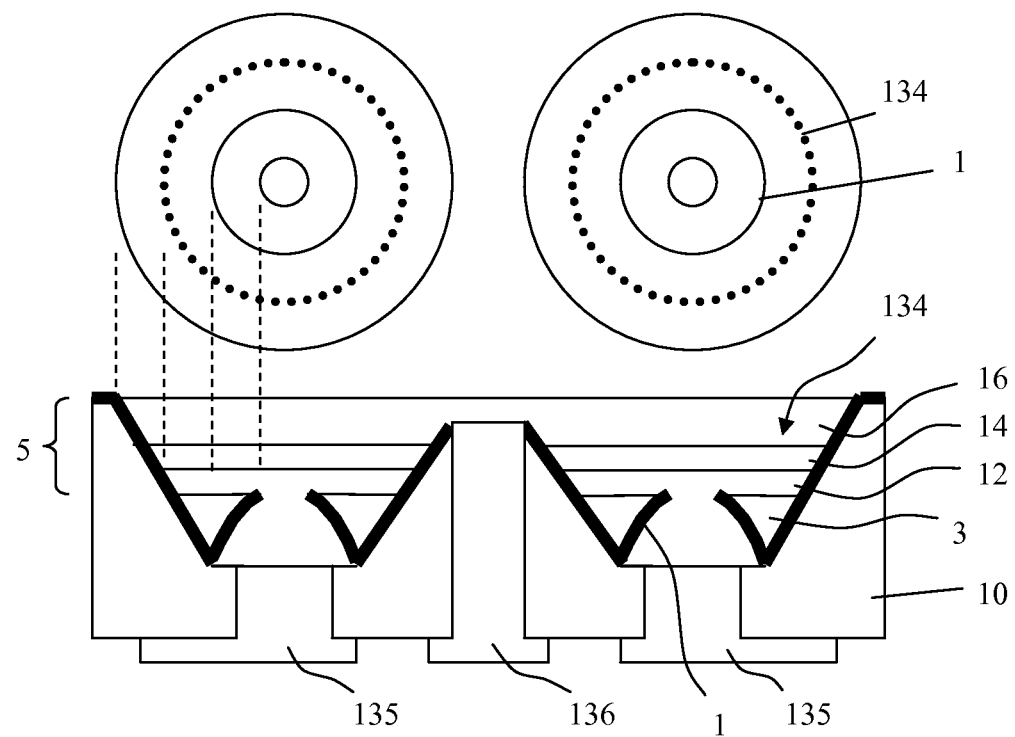

Optionally the first surface of the substrate may comprise a structured surface that has a recess. The recess of the structured substrate surface may be substantially linear, curved, rectangular, triangular, a trapezoidal, symmetrical, asymmetrical, and the like in cross section. The shell member may be formed on the structured first surface of the substrate 10. The shell 1 may reside on the top 131 or in the recess 132 as shown in FIG. 13A and FIG. 13B, respectively, which are simplified, cross-sectional views illustrating the device according to another embodiment of the present invention. The layer growth mainly commences from within the shell and is substantially suppressed elsewhere. After layer growth, conventional contact electrodes may be deployed for current injection. Optionally a conductive feed through, e.g., a Cu-plated via hole in the substrate 10 may be employed as the lower current path. The light emitter 133 may form substantially in the recess 132 as illustrated in FIG. 13C. In still another embodiment, the active region 14 may grow in the recess while the upper layer, e.g., p-GaN layer 16 may coalesce into a film as illustrated in FIG. 13D. The present device may comprise a substrate having a first surface, which is a structured first surface having a recess. A shell member formed in the recess of the structured first surface, comprising a shell portion that has an opening; a light emitting structure fabricated using the shell member, comprising a lower layer of the first conductivity type, an active layer, an upper layer of the second conductivity type; and electrical connections to lower layer of the first conductivity type and upper layer of the second conductivity type, respectively. The light emitting structure may comprise light-emitting segments 134 in the shape of e.g. a stripe or a disk formed substantially in the recess. The structured surface external of the shell portion may be substantially reflective in the spectral region of interest selected from UV, visible, and infrared. The shell portion may have a contour resembling that of a dome, a box, a cone, a paraboloid, a truncated dome, a truncated cone, a truncated paraboloid, a saddle and the like. The shell member may be selected from the group comprising a dielectric material, a metal, a cavity, and combinations thereof. The recess in the structured surface of the substrate may be substantially linear, curved, rectangular, triangular, a trapezoidal, symmetrical, asymmetrical, and the like in cross section. When a directional luminance is desirable, the shape of the recess may preferably approximate that of a paraboloid or a truncated paraboloid. The light emitting element may be centered near the focal point of the paraboloid. More light may be collimated and the beam output of the present device becomes more directional. It is also useful as a high-brightness light source for miniature illuminating applications, e.g., Lab-on-chips and guided light pipes (GLP). Examples may include endoscope and high bit-rate optical link for microprocessors, where light is transported from one point to another at a minimal loss. The present device is advantageous over the prior art devices since more light would fall within the critical angle and couple into the wave guide. The quest of using a sophisticated collimating optics may be relaxed.

The present device may further comprise a wafer-level-package (WLP) having conductive feed through in the substrate for electrical connections. For example, the shell member may be formed on the structured surface of a Si substrate. The wafer is loaded in a MOVPE chamber to grow the LED structure in the recess. Conductive feed through, e.g., through-silicon via (TSV) is drilled in the thinned Si substrate to form electrical connections 135, 136 as illustrated in FIG. 13D. It may be a Cu-plated feed through with a proper isolation e.g., $SiO_2$ to avoid short circuit to the device structure (not shown in Drawings for clarity). A Zener diode for ESD protection and a driver circuitry may be integrated in the present device as described in U.S. Pat. No. 8,044,412 to Murphy et al. In the prior art device, a fabricated LED chip is mounted in the recess of a substrate using a solder or a glue. Die attach in a recess requires a precise alignment. It may also increase the thermal resistance of the package. In contrast, the present device may be fabricated using a shell member on a silicon substrate. The LED structure may form an integral part of the silicon package. Thus the present device may be more compatible with the WLP process from the IC industry for further cost reduction. These benefits are significant, unique and unexpected for one skilled in the field using the conventional LED design.

Figure 14:
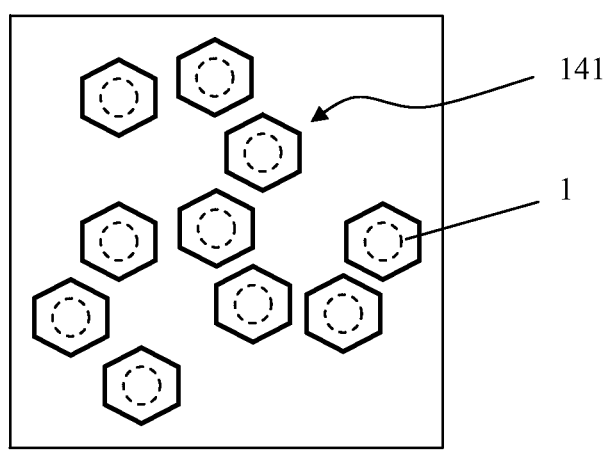
FIG. 14 is a simplified, top view illustrating an LED device that has configured light emitting pixels according to another embodiment of the present invention. The contour of shell member is represented by the dashed lines.
Figure 15A:
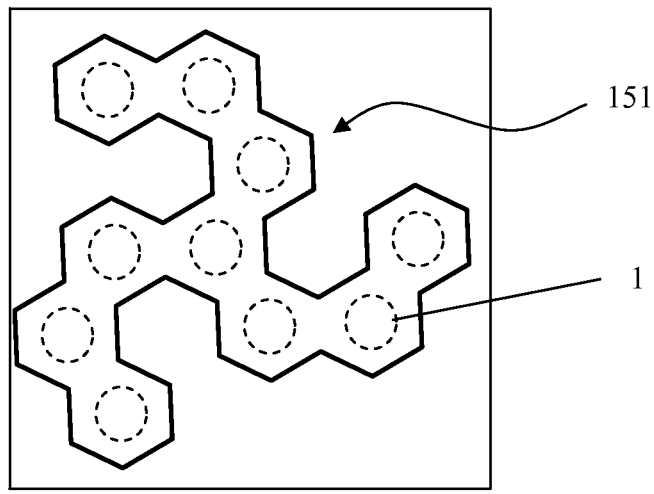
FIG. 15A is a simplified, top view illustrating an LED device that has a configured light emitting structure according to another embodiment of the present invention. The light emitting structure may have holes as shown in FIG. 15B. The contour of shell member is represented by the dashed lines.
Figure 15B:
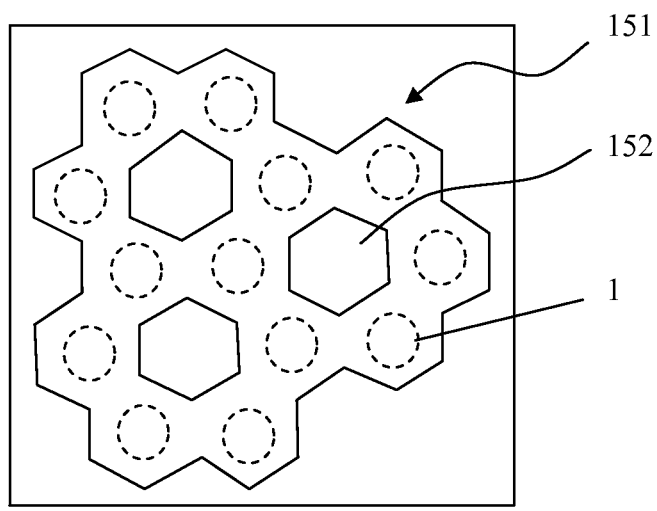

FIG. 14 illustrates a simplified top view of the LED device according to another embodiment of the present invention. In this example, the shells 1 and the light emitting pixels 141 may be configured in a pattern. It may be arranged resembling that of a star, a round figure, a ring, a swirl, a blossom, an echelon, a galaxy, etc. FIG. 15A and FIG. 15B are simplified, top views of the LED device according to another embodiment of the present invention. In this example, the light emitting pixel may cross coalesce forming a light emitting structure 151 that is also configured in a pattern. The present device may further comprise an opening 152, e.g., branches and holes in the light emitting structure. The beam profile of the present device thus may form a desirable radiation pattern. In the prior LED devices, a complicated lens is often needed to couple the luminance of the LED to the luminaries. By using a deliberately configured shell member, the present device may radiate in a pattern resembling that of, for example, a point light source, e.g., a Lambertian emitter, a batwing emitter, a side emitter, or a narrow angle emitter. The present light-emitting device may be further incorporated in an LED module. The module may further comprise a PCB, e.g., MCPCB, similar to that illustrated in FIG. 7C. The present devices may be laid out in a formation such that the constituent radiation from individual light emitting device may be united collectively to form a new radiation pattern of the present light emitting module. The burden of using sophisticated lens optics to match the optics of the luminaries may be relaxed. The presence of openings in the present device may also facilitate extraction of light and heat from the light emitting structure. These benefits are significant, unique and unexpected for one skilled in the field using the conventional LED design.

Figure 16:
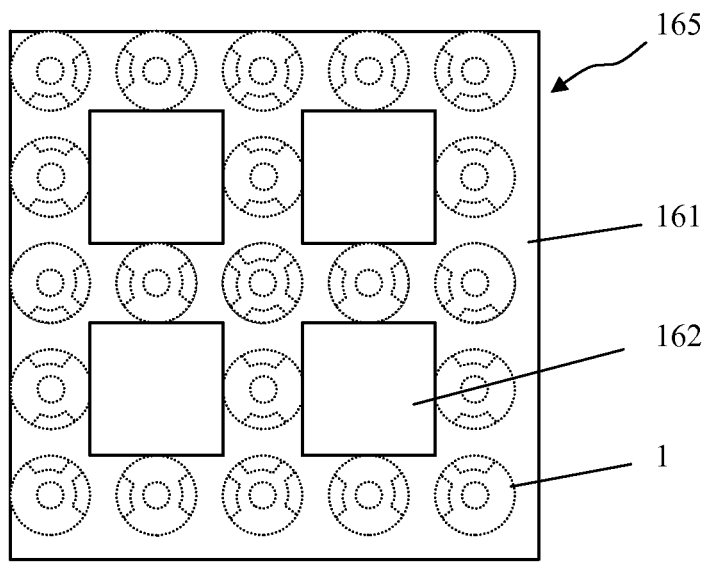
FIG. 16 illustrates a simplified, top view of an LED device comprising a light emitting structure that has a web or mesh pattern comprising grids and holes according to another embodiment of the present invention. The contour of shell member is represented by the dashed lines.

The present device may further comprise shells having multiple openings facing designated directions. Coalescing of the layer emerging from the shell becomes spatially more selective. Light emitting structures having a more delicate pattern and beam profile can be realized. The openings may be of different size and shape and the patterned LED structure may further comprise uneven sections. Layer deposition over uneven sections often causes deviations in layer thickness, alloy composition, and impurity doping. Each section may emit a light having a different dominant radiation in the spectral region of interest selected from UV, visible, and infrared. The lights are intimately color mixed to generate the light emission of the present device. By choosing the shell design and growth ambient, a white light emission can be delivered in the present device. FIG. 16 is a simplified top view illustrating an LED device according to another embodiment of the present invention. In this example, there are four openings in the center shell and three openings in the junction shell. The corner and side shells have two opening facing different directions. The light emitting structure 165 may form a web or a mesh pattern that has grids 161 and holes 162. In the present device, more light may escape from the holes and the extraction efficiency is higher. Moreover, the heat generated from the junction may radiate out through the holes. There is less heat accumulation enabling reliable operation of the present device. These benefits are significant, unique and unexpected for one skilled in the field using the conventional LED design.

Figure 17:
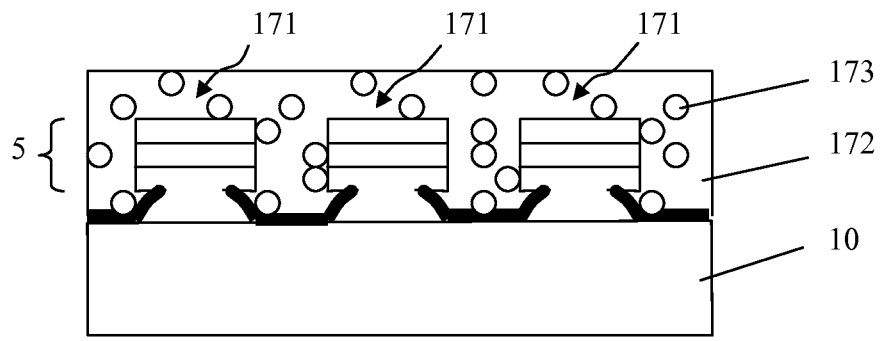
FIG. 17 is a simplified, cross-sectional view illustrating an LED device that has a resin dispersion of light conversion particles according to another embodiment of the present invention.
Figure 18:
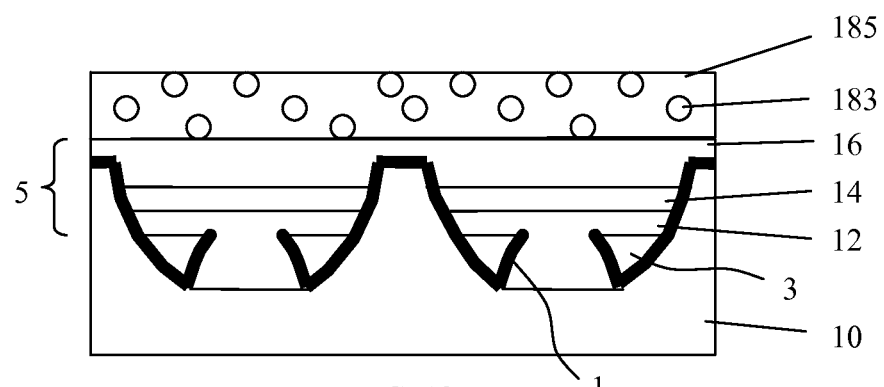
FIG. 18 is a simplified, cross-sectional view illustrating an LED device that has a resin sheet containing light conversion particles according to another embodiment of the present invention.

Optionally the present device may further comprise at least one type of light conversion material, e.g. a phosphor that absorbs a portion of the radiation in the first wavelength region of the spectrum from the active region and emits a radiation in a second wavelength region of the spectrum. The radiations emitted from the light emitting device and from the light conversion material may be substantially complementary in color. The emissions may be color-mixed to generate a white light emission in the present device as perceived to the naked eye. FIG. 17 is a simplified, cross sectional view illustrating an LED device according to another embodiment of the present invention. In this example, the light emitting pixels 171 are sealed in a resin 172 dispersion of light conversion particle 173. The light conversion material may be applied in different ways, e.g. resin dispersion, a sheet dispersion, a ceramic dispersion, a phosphor coating, a phosphor plate, a phosphor cap, etc. FIG. 18 is a simplified, cross sectional view illustrating an LED device according to another embodiment of the present invention. In this example, a resin sheet 185 containing the phosphor particles 183 is applied to the surface of the light emitting structure 5. Optionally the shell member and the external substrate may constitute a reflective surface to enhance directional beam output or to reduce substrate absorption loss. Examples of the light conversion material may comprise a phosphor, e.g., a garnet phosphor, silicate phosphor, nitride phosphor, sulfide phosphor, and combinations thereof. The phosphor particle can be of few nm to 50 µm in size, preferably 0.1 µm to 10 µm in size. For a GaN LED that emits a blue light around 450 nm to 460 nm, a phosphor that absorbs in blue and emits in yellow-green may be used to generate a white light emission in the present device. Examples of the phosphor may include a garnet phosphor such as cerium-activated yttrium-aluminum garnet $Y_3Al_5O_{12}$ (YAG:Ce). A silicate phosphor such as europium-doped ortho-silicate phosphor $(Ba,Sr)SiO_4$:Eu, a phosphate phosphor, and a sulfur-containing phosphor may be also used. A nitride phosphor such as SiAlON phosphor, $CaAlSiN_3$ phosphor may be employed for better stability and color fidelity.

In another embodiment of the present invention, the present devices are further incorporated in an LED package, module, and system using wire bonding, flip chip bonding, thin film bonding, and surface mounting. A control IC, a driver circuitry, a power supply may be added to the module. A heat sink, a secondary optics and lamp housing may be added to the assembly to form a complete lighting system. The present device may be used in a display backlighting unit for LED TV, monitor, tablet, mobile phone applications. The present device can be also used as a light source in general lighting, vehicle lighting, street lighting, to name just a few.

To those skilled in the art, it is apparent that there may be alternations and modifications either implied from or suggested by the teaching in the description and in the drawings in the present invention. Accordingly, the present invention is to be limited solely by the scope of the following claims.

What is claimed is:

1. A light emitting device comprising:
   a shell member comprising a plurality of planar portions and shell portions, said shell portions further comprising an opening;
   a light emitting structure comprising a lower layer of a first conductivity type, an active layer, an upper layer of a second conductivity type;
   a first electrode connected to said lower layer of a first conductivity type;
   a second electrode connected to said upper layer of a second conductivity type;
   and
   a plurality of gaps abutting said shell member;
   wherein:
   said lower layer of a first conductivity type of said light emitting structure is formed substantially from an inner space confined by said shell portions;
   said shell member is selected from a reflective material, a dielectric material, a metal, a cavity, or combinations thereof;
   said light emitting structure is selected from group III-V semiconductor materials or group II-VI semiconductor materials.

2. The light emitting device of claim 1, further comprising a substrate; wherein:
   said substrate comprising a first surface;
   said shell member is formed on said first surface of said substrate;
   said planar portions of said shell member are substantially coupled to said first surface of said substrate;
   a portion of said first surface of said substrate is confined by said shell portions of said shell member;
   said lower layer of a first conductivity type of said light emitting structure is deposited substantially from said first surface of said substrate confined by said shell portions of said shell member;
   said substrate is selected from group III-V materials, group IV elements or alloys, group II-VI materials, ZnO, spinel, or sapphire;
   said light emitting structure and said substrate comprising a lattice-mismatched misfit system.

3. The light emitting device of claim 2, further comprising a base layer on said first surface of said substrate; wherein:
   said shell member is formed on said base layer;
   said planar portions of said shell member are substantially coupled to said base layer;
   a portion of said base layer is confined by said shell portions of said shell member, said lower layer of a first conductivity type of said light emitting structure is deposited substantially from said base layer confined by said shell portions of said shell member.

4. The light emitting device of claim 1, wherein said shell portions are substantially linear, curved, rectangular, triangular, trapezoidal, parabolic, tidal-wave like, symmetrical, or asymmetrical in at least one cross section.

5. The light emitting device of claim 2, further comprising a growth suppression zone on said first surface of said substrate confined by said shell portions; wherein said lower layer of a first conductivity type of said light emitting structure is deposited substantially from said first surface of said substrate confined by said shell portions and by said growth suppression zone.

6. The light emitting device of claim 2, wherein said light emitting structure further comprising an architecture of light emitting pixels, assorted light emitting groups, or light emitting segments.

7. The light emitting device of claim 6, wherein said light emitting structure and/or light emitting pixels are configured in a pattern.

8. The light-emitting device of claim 1, wherein said shell member is substantially reflective in the spectral region of interest selected from UV, visible, or infrared.

9. The light-emitting device of claim 1, further comprising a conduit partially connecting said shell portions of said shell member.

10. The light-emitting device of claim 1, wherein said shell portions are compiled in a substantially stacked, spaced, coupled, branched, or entwined geometry.

11. The light emitting device of claim 1, wherein said light emitting structure further comprising discontinuities, openings, gaps, or holes.

12. The light-emitting device of claim 1, further comprising a plurality of stacks of gaps abutting said shell member.

13. The light-emitting device of claim 1, wherein said light emitting structure further comprises a plurality of active regions in and out of said shell portion of said shell member; said a plurality of active regions emit lights having different dominant radiations in the spectral region of interest selected from UV, visible, or infrared.

14. The light-emitting device of claim 1, wherein said light emitting structure is configured to emit light that is color-mixed to generate a white light emission perceived to the naked eye.

15. The light-emitting device of claim 1, further comprising a substrate, wherein said shell member is formed on a first surface of said substrate, wherein said first surface of said substrate comprises a structured surface having a recess, wherein said recess of said structured surface is substantially linear, curved, rectangular, triangular, a trapezoidal, symmetrical, or asymmetrical in a cross section, wherein said shell portion is formed substantially in said recess.

16. The light-emitting device of claim 1, wherein said light emitting structure has a web pattern comprising grids and holes.

17. An LED module formed by using said light-emitting device of claim 1, further comprising a radiation pattern substantially resembling that of a Lambertian emitter, a batwing emitter, a side emitter, or a narrow angle emitter.

18. The light emitting device of claim 1, wherein said shell portions further comprising a contour substantially resembling the general shape of a dome, a box, a cone, a paraboloid, a truncated dome, a truncated cone, a truncated paraboloid, or a saddle.

19. The light emitting device of claim 2, further comprising a first layer deposited substantially from said first surface of said substrate confined by said shell portions; wherein said light emitting structure is formed on said first layer.

20. The light emitting device of claim 1, wherein said shell portions of said shell member are deployed in a regular or an irregular array of dots or stripes in a planar layout.

21. The light emitting device of claim 1, wherein said shell portions further joining each other leaving little or no space for said planar portions.

22. The light emitting device of claim 1, wherein said a plurality of gaps further comprising unfilled gaps in an inner space confined by said shell portions.

23. The light emitting device of claim 2, wherein said first surface of said substrate further comprising a structured surface.

24. The light emitting device of claim 1, further comprising a carrier substrate; wherein said light emitting structure is bonded to said carrier substrate.

25. The light emitting device of claim 1, further comprising a light conversion material that absorbs a portion of a first radiation from said light emitting structure and emits a second radiation that is substantially complementary in color to said first radiation from said light emitting structure.

26. The light emitting device of claim 1, wherein said shell portions are less than a micron in thickness.

27. An assembly for general lighting or display applications comprising the light emitting device of claim 2, further comprising at least one of a lead frame, a printed circuit board, a control IC, a driver circuitry, an ESD protection, a heat sink, or a housing.

28. The assembly of claim 27, wherein said light emitting device is incorporated in at least one of face-up, face-down, flip-chip, chip-on-board, or wafer-level-package configurations.

29. The assembly of claim 27 having said light emitting device incorporated by at least one of wire bonding, flip-chip bonding, thin-film bonding, or surface mounting processes.

30. A method of fabricating the light emitting device of claim 1, wherein said shell member is fabricated using at least one of photolithographic method, imprinting method, or embossing method.

* * * * *